US009911525B2

(12) United States Patent
Stelzer et al.

(10) Patent No.: US 9,911,525 B2
(45) Date of Patent: Mar. 6, 2018

(54) WIRING ASSEMBLY AND METHOD OF FORMING A CHANNEL IN A WIRING ASSEMBLY FOR RECEIVING CONDUCTOR AND PROVIDING SEPARATE REGIONS OF CONDUCTOR CONTACT WITH THE CHANNEL

(71) Applicant: Advanced Magnet Lab, Inc., Palm Bay, FL (US)

(72) Inventors: Gerald Stelzer, Palm Bay, FL (US); Rainer Meinke, Melbourne, FL (US); Mark Senti, Malabar, FL (US)

(73) Assignee: Advanced Magnet Lab, Inc., Palm Bay, FL (US)

( * ) Notice: Subject to any disclaimer, the term of this patent is extended or adjusted under 35 U.S.C. 154(b) by 0 days.

(21) Appl. No.: 14/554,312

(22) Filed: Nov. 26, 2014

(65) Prior Publication Data

US 2015/0137920 A1    May 21, 2015

Related U.S. Application Data

(63) Continuation of application No. 12/061,797, filed on Apr. 3, 2008, now abandoned.

(51) Int. Cl.
*H01F 27/30* (2006.01)
*H01F 5/00* (2006.01)
(Continued)

(52) U.S. Cl.
CPC ........... *H01F 5/06* (2013.01); *G01R 33/3802* (2013.01); *H01F 6/06* (2013.01); *H01F 7/20* (2013.01);
(Continued)

(58) Field of Classification Search
CPC ..... H01F 6/02; H01F 6/06; H01F 5/06; H01F 7/20; H01F 41/04; H01F 41/098;
(Continued)

(56) References Cited

U.S. PATENT DOCUMENTS

| 2,982,888 | A | * | 5/1961 | Whearley | ................ H01F 5/02 174/120 R |
| 3,197,680 | A | | 7/1965 | Wingerson | |

(Continued)

FOREIGN PATENT DOCUMENTS

| CA | 968398 | 5/1975 |
| EP | 0353153 | 1/1990 |

(Continued)

OTHER PUBLICATIONS

R.B. Meinke, M.J. Ball, C.L. Goodzeit, "Superconducting Double-Helix Accelerator Magnets", IEEE Proceedings of the 2003 particle Accelerator Conference, 2003, vol. 3, pp. 1996-1998.
(Continued)

*Primary Examiner* — Mangtin Lian
(74) *Attorney, Agent, or Firm* — Stephen C. Thomas

(57) ABSTRACT

A conductor assembly and method for constructing an assembly of the type which, when conducting current, generates a magnetic field or which, in the presence of a changing magnetic field, induces a voltage. In one embodiment the method provides a first insulative layer tubular in shape and including a surface along which a conductor segment may be positioned. A channel formed in the surface of the insulative layer defines a first conductor path and includes a surface of first contour in cross section along a first plane transverse to the conductor path. A segment of conductor having a surface of second contour in cross section is positioned at least partly in the channel and extends along the conductor path. Along the first plane,
(Continued)

contact between the conductor surface of second contour and the channel surface of first contour includes at least two separate regions of contact.

17 Claims, 16 Drawing Sheets

(51) Int. Cl.

| | | |
|---|---|---|
| H01L 39/24 | (2006.01) | |
| H01F 7/06 | (2006.01) | |
| H01F 5/06 | (2006.01) | |
| G01R 33/38 | (2006.01) | |
| H01F 6/06 | (2006.01) | |
| H01F 7/20 | (2006.01) | |
| H01F 41/04 | (2006.01) | |
| H01F 41/086 | (2016.01) | |
| H01F 41/071 | (2016.01) | |
| H01F 41/098 | (2016.01) | |
| G01R 33/28 | (2006.01) | |
| G01R 33/3815 | (2006.01) | |
| H01F 6/02 | (2006.01) | |

(52) U.S. Cl.
CPC ........... *H01F 41/04* (2013.01); *H01F 41/071* (2016.01); *H01F 41/086* (2016.01); *H01F 41/098* (2016.01); *G01R 33/288* (2013.01); *G01R 33/3815* (2013.01); *H01F 6/02* (2013.01); *Y10T 29/4902* (2015.01); *Y10T 29/49014* (2015.01); *Y10T 29/49073* (2015.01)

(58) Field of Classification Search
CPC . H01F 41/086; H01F 41/071; G01R 33/3802; G01R 33/288; G01R 33/3815; C10T 29/49014; C10T 29/49073; C10T 29/4902
USPC ........... 29/599, 606; 335/299; 336/208, 199
See application file for complete search history.

(56) References Cited

U.S. PATENT DOCUMENTS

| | | | |
|---|---|---|---|
| 3,559,126 A | 1/1971 | Drautman | |
| 3,761,752 A | 9/1973 | Anderson | |
| 4,271,463 A * | 6/1981 | Tanimura | H01F 38/42 336/185 |
| 4,283,687 A | 8/1981 | Madey | |
| 4,639,708 A | 1/1987 | Weatherly | |
| 5,767,759 A | 6/1998 | Rouet | |
| 5,954,909 A | 9/1999 | Davidson | |
| 6,091,590 A * | 7/2000 | Sakamoto | F16D 27/112 336/192 |
| 6,921,042 B1 * | 7/2005 | Goodzeit | H01F 7/202 242/430 |
| 2004/0257190 A1 | 12/2004 | Peck | |
| 2006/0080829 A1 | 4/2006 | Bushnell | |

FOREIGN PATENT DOCUMENTS

| | | |
|---|---|---|
| EP | 0954009 | 11/1999 |
| FR | 2550026 | 2/1985 |

OTHER PUBLICATIONS

C.L. Goodzeit, R.B. Meinke, et al., "High Power Density Marine Propulsion Motors with Double-Helix Coils", Applied Superconductivity Conference, Aug. 27-Sep. 1, 2006, Seattle WA.

S. Caspi, et al, "Design Fabrication, and Test of a Superconducting Dipole Magnet Based on Titled Solenoids", IEEE Transactions on Applied Superconductivity, vol. 17, No. 2 Jun. 2, 2007, pp. 2266-2269.

A.R. Borden and R.C. Wolgast, "Mechanically Improved Rectangular Cable", IEEE Transactions on Nuclear Science, vol. NS-30, No. 4, Aug. 1983, pp. 3399-3401.

A. Akhmeteli, et al, "Superconducting and Resistive Tilted Coil Magnets for Generation of High and Uniform Transverse Magnetic Field", IEEE Transactions on Applied Superconductivity, vol. 15, No. 2, Jun. 2005, pp. 1439-1443.

Ball, MJ et al, Modulated Double Helix Quadrupole Magnets, IEEE Transactions on Applied Superconductivity, IEEE Service Center Los Alamitos CA, US vol. 13, no. 2—Jun. 1, 2003, pp. 1369-1372.

Ball, MJ et al, "The Double Helix dipole—a novel approach to Accelerator Magnet Design" IEEE Transactions on Applied Superconductivity, IEEE Service Center Los Alamitos, CA, US, vol. 13, No. 2—Jun. 1, 2003, pp. 1365-1368.

* cited by examiner

WIRING ASSEMBLY AND METHOD OF FORMING A CHANNEL IN A WIRING ASSEMBLY FOR RECEIVING CONDUCTOR AND PROVIDING SEPARATE REGIONS OF CONDUCTOR CONTACT WITH THE CHANNEL

PRIORITY BASED ON RELATED APPLICATIONS

This application is a continuation of U.S. patent application Ser. No. 12/061,797 filed on Apr. 3, 2008 and U.S. patent application Ser. No. 14/554,255 filed Nov. 26, 2014.

STATEMENT REGARDING FEDERALLY SPONSORED RESEARCH AND DEVELOPMENT

The United States Government may have certain rights in this invention pursuant to U.S. Government Contract Number DE-FG02-06ER84492 awarded by the United States Department of Energy.

FIELD OF THE INVENTION

This invention relates to electromagnetic systems, including systems which generate magnetic fields, systems which generate electric power, motors, and magnets generally. More particularly, the invention relates to systems of the type including conductor assemblies which, when conducting current, generate a magnetic field or which, in the presence of a changing magnetic field, induces a voltage.

It is of continued importance across many business sectors of the economy (e.g., R&D, power generation, motors and medical applications) to achieve improved performance in magnetic conductor assemblies. Development of new and improved commercial applications is dependent on an ability to create large and uniform magnetic fields. For example, potential uses of medical procedures such as Magnetic Resonance Imaging (MRI) may be realized with improved performance of magnets. Further, advancements are needed in numerous performance and reliability factors in order to realize commercially useful embodiments for wider use in medical, industrial and commercial applications. For example, it is desirable to make charged particle cancer treatment (e.g. proton and carbon therapy) more available to patients, but these systems require cyclotrons and very large magnets to steer beams of high energy charged particles, e.g., proton beams or carbon beams. System size and cost severely limit availability of these applications. Currently, the gantries used for proton therapy treatment rooms may extend multiple stories in height and weigh over one hundred tons. Generally, a major impediment to further deployment of these and other charged particle beam systems is the size and cost of the beam acceleration, steering and focusing equipment.

In the long term, for charged particle therapy and certain other high magnetic field applications, it is likely that superconducting magnets will be preferred over resistive magnets. Generally, superconducting magnets offer relatively higher fields and can be substantially smaller in size. Moreover, for a given field strength, a superconducting magnet consumes less power. However, reliability of these magnets is sometimes problematic because the well-known phenomenon of quenching (when the superconducting material transitions to a normal, non-superconducting state) can result in rapid formation of a high temperature hot spot which can destroy a magnet.

Designs which improve reliability have been costly. Cost is a major constraint for conventional superconducting magnet technologies which rely on saddle or racetrack coils. Moreover, for a given set of operating conditions, significant design efforts must be employed to assure that quenching does not occur during normal system use.

Whether future systems employ resistive or superconductive windings, a need will remain to improve design efficiency, reliability and field quality. For example, in order to deploy carbon-based systems for charged particle cancer treatment, the use of superconducting magnets may be imperative in order to meet the bending requirements of the high energy carbon beam. Coil segments used to bend beams are very complex and must be mechanically very stable in order to prevent conductor movement which leads to quenches of superconducting coils.

At the same time, it is necessary to provide lower cost systems costs in order to encourage wider uses that benefit society. By way of illustration, mechanical structures required to assure stabilization of conductor windings in the presence of large fields are effective, but they are also a significant factor in overall system cost. Moreover, being subject to wear, e.g., affecting the insulation system of the conductor, under conditions of continued use, such systems also require costly maintenance and repair. Design improvements which substantially reduce these life cycle costs and the overall affordability of high field systems can accelerate deployment of useful systems that require generation of large magnetic fields.

SUMMARY OF THE INVENTION

In accord with exemplary embodiments of the invention, there is provided a conductor assembly of the type which, when conducting current, generates a magnetic field or which, in the presence of a changing magnetic field, induces a voltage. An associated method for constructing the conductor assembly is also provided.

In one series of embodiments, the method includes providing a first insulative layer tubular in shape and including a surface along which a conductor segment may be positioned. A channel is formed in the surface of the insulative layer defining a first conductor path. The channel includes a surface of first contour in cross section along a first plane transverse to the conductor path. A segment of conductor is provided, having a relatively large length dimension in proportion to a thickness measurable along a direction transverse to the length dimension. The segment has a surface of second contour in cross section along a plane transverse to the length dimension. The segment of conductor is positioned at least partly in the channel with the length dimension extending along the conductor path. Along the first plane, contact between the conductor surface of second contour and the channel surface of first contour includes at least two separate regions of contact. In one example of the method, the channel surface includes a relatively flat portion extending along the channel path with the flat portion including one of the two separate regions of contact. Along multiple spaced-apart positions of the conductor path an angle of the relatively flat channel surface portion relative to an adjacent portion of the insulative layer surface into which the channel is formed is substantially invariant. In another example of the method, a portion of the channel surface includes three relatively flat surfaces each generally positioned along a rectangular contour. By rectangular contour it is meant that the channel includes a profile in cross section which includes three adjoining sides that are similar to three adjoining sides in a rectangle, although the sides and angles may not conform precisely with those of a rectangular shape and the contour may therefore be referred to as being of rectangular-like profile or shape. The three sides may have angular relationships which are similar to or approximate that characteristic of a rectangle.

According to an embodiment of the conductor assembly a layer includes a surface of tubular shape with a channel formed therein. The layer follows a path about an axis. The channel is characterized by a cross sectional shape along a plane passing transversely through a portion of the path. A conductive segment is positioned in the channel and extends along the channel path. The segment has an outermost surface region positioned at least partly within the channel, with a first portion of the outermost surface region contacting the channel surface at a first location on the channel surface and a second portion of the outermost surface region contacting the channel surface at a second location on the channel surface. A third portion of the outermost surface region of the conductive segment is positioned between the first and second portions and is spaced away from an area of the channel surface positioned between the first and second locations on the channel surface.

DETAILED DESCRIPTION OF THE INVENTION

Figure 1A:
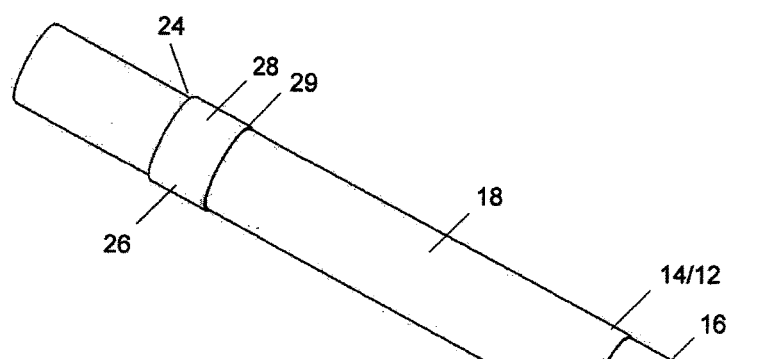
FIGS. 1A-1M illustrate fabrication features for construction of a coil according to embodiments of the invention.

Before describing in detail the particular methods and apparatuses related to embodiments of the invention, it is noted that the present invention resides primarily in a novel and non-obvious combination of components and process steps. So as not to obscure the disclosure with details that will be readily apparent to those skilled in the art, certain conventional components and steps have been omitted or presented with lesser detail, while the drawings and the specification describe in greater detail other elements and steps pertinent to understanding the invention. Further, the following embodiments do not define limits as to structure or method according to the invention, but only provide examples which include features that are permissive rather than mandatory and illustrative rather than exhaustive.

The concept of using pairs of helically-wound, concentrically positioned coils with opposite tilt angles to produce a magnetic field has been described in U.S. Pat. No. 6,921, 042 incorporated herein by reference. Accordingly, cancellation of an axial field component can be effected, this sometimes resulting in a uniform dipole field. See, for example, Goodzeit et al., "The Double-Helix Dipole—A Novel Approach to Accelerator Magnet Design", *IEEE Transactions on Applied Superconductivity*, Vol. 13, No. 2, June 2003, pp. 1365-1368, which describes analytics for a double helix magnet geometry. Generally, for these and other magnet geometries, some of these being racetrack and saddle configurations, placement of conductor has been problematic for multiple reasons. In conventional racetrack and saddle configurations, based on circular-shaped cable, the position of each wire turn has depended on the position of a previous wire turn. Such windings typically build on one another with a second row of turns being tightly wound over a previously wound row of turns. The windings are often generated with assistance of tooling that assures consistency as turns in each row are wound tightly against one another and as turns in consecutive rows are created one over the other. This tight nesting or stacking of turns has provided a means to stabilize the conductor, but as the winding structure is built into multiple stacked rows it assumes a pyramid-like appearance along the edges. That is, when a turn is created over a prior-wound row, the wire in the outer row nests in a crevice created by a pair of adjoining wires in the immediately prior, inner row. As the structure is built up with multiple rows, each additional row has one less turn at each edge. Along each edge, the stack assumes a slant profile whereby the resulting coil has fewer turns at each edge to produce the field. Further, this type of configuration requires contact between turns in the same row as well as between turns in adjoining rows. Therefore the conductor has required an insulative coating on the conductor surface so that portions of the conductor coming into contact with other portions of the conductor are insulated from one another. To assure stability of the winding under high field conditions the turns are commonly bonded to one another with, for example, an adhesive. In the prior systems the position and stability of the conductor has depended on the positioning of each conductor turn against another conductor turn and the ability to maintain a static position during manufacture, assembly and typical thermal cycling experienced during use.

Figure 1B:
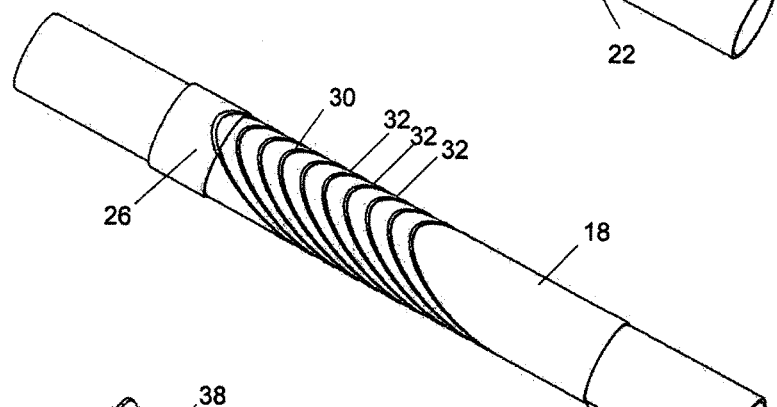
Figure 1C:
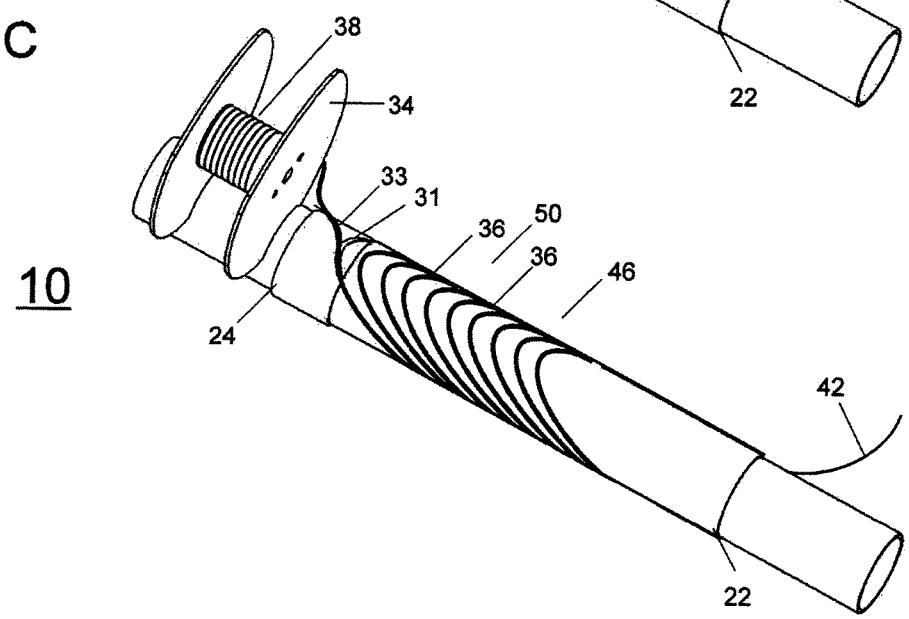
Figure 1D:
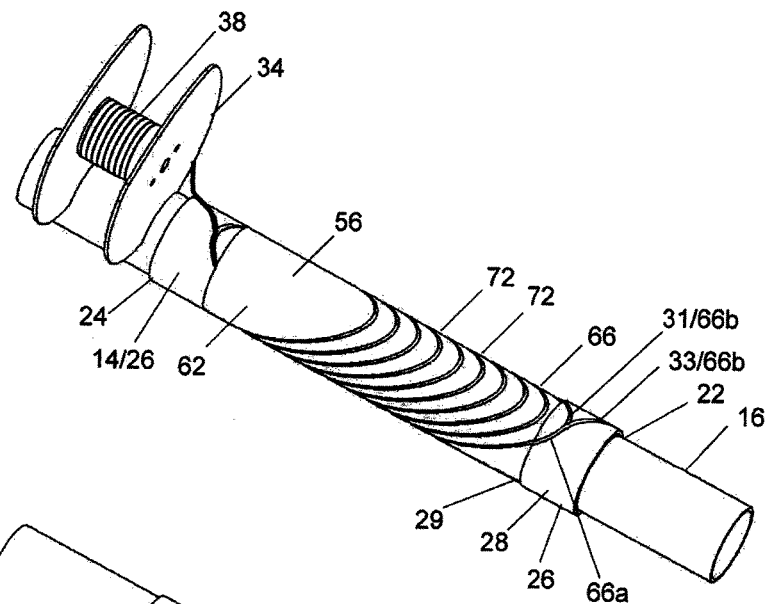
Figure 1E:
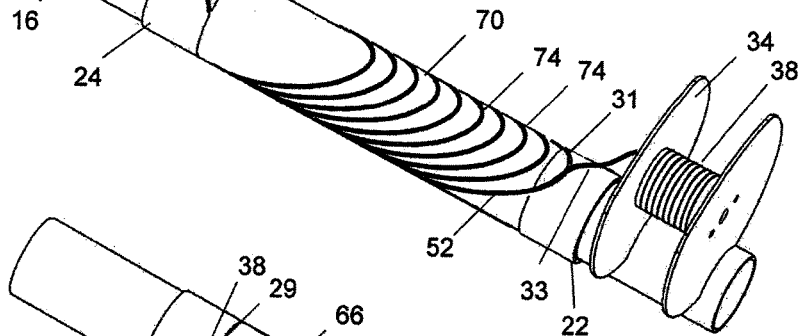
Figure 1F:
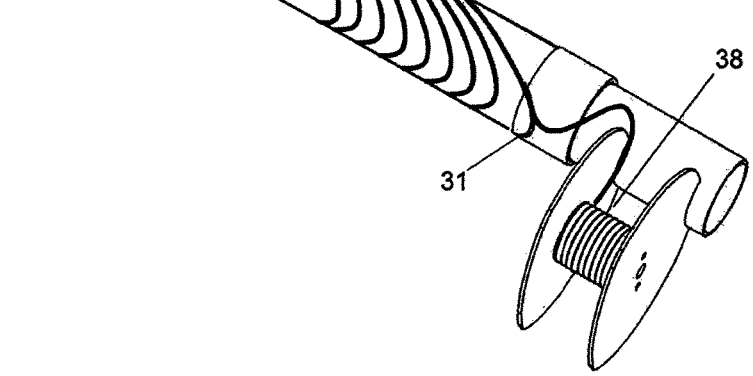
Figure 1G:
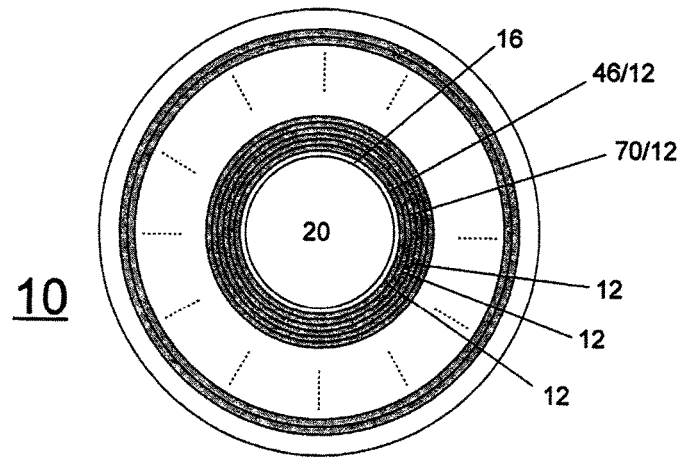
Figure 1H:
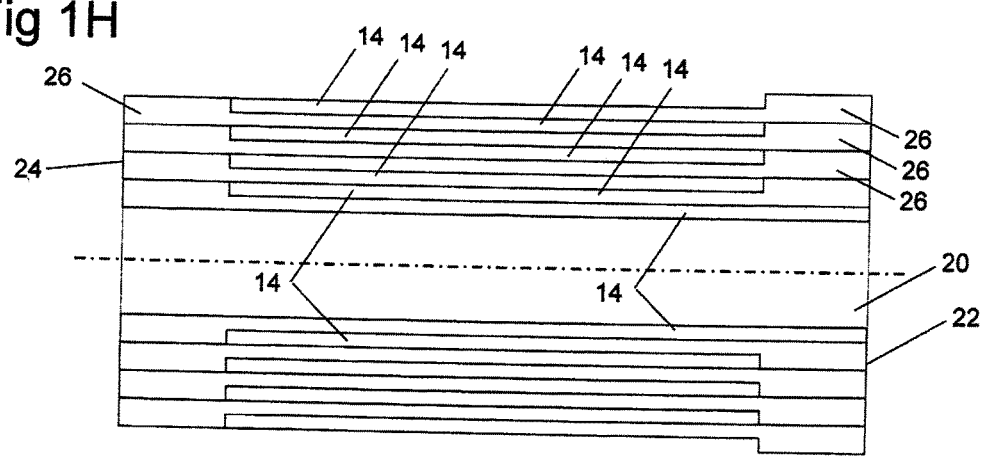

FIGS. 1A-1J illustrate fabrication features for construction of a coil 10 according to embodiments of the invention. The design incorporates a tilted double helix conductor configuration which may be as described in U.S. Pat. No. 6,921,042 with axial field components canceled in order to generate a predominantly transverse field. FIG. 1G provides a view in cross section of the coil 10 along a plane cutting through an aperture formed therein. The coil includes multiple coil rows 12, specific ones of which are also referred to herein with other reference numbers, of helical conductor with each row of conductor formed in an insulative layer. Each of the coil rows 12 is concentrically placed with respect to the other rows 12. Portions of the conductor in different ones of the rows 12 are electrically isolated from one another by one or more layers of the insulator as illustrated in the figures. The various layers of insulator when referenced generally or collectively are referred to as layers 14. Other reference numbers are used when referring to specific layers of insulator in the coil 10. The insulator may be a relatively rigid non-conducting composite material in which channels can be machined for stable positioning of the conductor in each coil row. However, the invention is not at all limited to such designs or to the arrangement of tilted helical patterns shown for the coil 10.

One exemplary fabrication sequence, suitable for manufacturing numerous embodiments of coils begins with formation and curing of a layer 14 of composite material about a core. The core may be a removable mandrel 16 as shown in the figures or may be a permanent structure, such as a stainless steel cylinder. The mandrel may be dissolvable or chemically removable. In other embodiments, the core may be a composite material formed, for example, of fiberglass resin and suitable for formation of one or more channels therein to define a core coil row. When multiple channels are formed in the same row they may be interlaced with one channel providing an auxiliary function such as cooling of the conductor. Permanent core structures may provide numerous functions in the final system, such as to define a useable aperture, or provide further structural support or to provide a suitable body, e.g., a stainless steel tube, for creating a vacuum in the aperture. The mandrel or the core may be insulative or conductive bodies. The illustrated mandrel 16 is a removable shaft suitable for mounting on a lathe or other tooling machine in order to process a workpiece. Portions of or the entirety of the machining process may be automated and implemented on a Computer Numerical Control (CNC) machine. A core may be formed of ceramic, composite material or other moldable or machinable material, and may be an insulator or a conductor. Although illustrated embodiments suggest cores of cylindrical shape, i.e., circular in cross section, other geometries are contemplated.

As shown in FIG. 1A, a layer 14 of insulator comprising a composite material is formed on the mandrel 16. Such a so-called lay-up may, for example, be a reinforced plastic comprising fibers, e.g., fiberglass, carbon or aramid, and a polymer, such as an epoxy or a thermosetting plastic. The layer 14 may be applied as a series of sublayers each comprising a thin, chopped strand or woven fiber mat through which a resin material permeates, or as a matrix of fiber particles and polymer. Thickness of the layer 14 is chosen based on numerous considerations including the thickness or diameter of the conductor to be placed on the layer, the desired depth to which the conductor is to be placed in the channel, and the minimum thickness of insulation between conductor material positioned in adjacent ones of concentric rows.

The composite layer 14 is cured in a conventional manner and then machined to desired tolerances. As shown in Figure 1A a substantial portion of the cured and machined layer 14 is in the shape of a regular cylinder having a cylindrical outer surface 18, but other symmetric and asymmetric geometries of the resulting coil may be fabricated in the same manner. Generally, the layer 14 may be tubular in shape, having in some embodiments a central axis of symmetry or multiple thicknesses or variable shape along an exterior surface. The aperture within the layer 14 may also be in the shape of a regular cylinder when the layer 14 is so shaped, but more generally may be tubular and of arbitrary shape in cross section. As now described for the composite layer 14, all of the composite layers, which insulate portions of the conductor material formed in the same or in different coil rows, have first and second opposing end regions which, individually or collectively, are referred to as first and second coil ends 22, 24. The coil ends 22, 24 are formed about a coil aperture 20, shown in the cross sectional view of FIG. 1G as having a circular shape corresponding to a cross section through a regular cylinder. The mandrel 16 extends beyond each of the ends 22, 24.

A feature of the coil 10 is that the layer 14 and other layers formed thereover include a shoulder region 26, alternately positioned at one or the other of the coil ends 22, 24. In FIG. 1A, the shoulder region 26 is adjacent the coil end 24. See, more generally, FIG. 1H which illustrates, in a simple cross sectional view taken along a plane extending along the aperture 20, the series of insulator layers 14 wherein, for each layer 14, a shoulder region 26 is formed at one end 22 or at the other end 24 in an alternating pattern extending from the aperture 20 outward.

The illustrated shoulder regions 26 are each in the form of a regular cylinder shape, having a cylindrical outer shoulder surface 28 which may be twice the thickness of other portions of the layer 14 that extend along the outer surface 18. The shoulder region may be formed by positioning approximately twice as much composite material in the shoulder region relative to the other portions of the layer 14. The cylindrical outer surfaces 18 and 28 and may be shaped by machining the layer 14 after the composite has cured. As illustrated, the shoulder region 26 may be defined with an abrupt, step-like transition 29 between the two surfaces 18 and 28 or the transition between the surfaces 18 and 28 may be gradual, along a sloped surface formed between the surfaces 18 and 28.

Referring next to FIG. 1B, a channel 30 along the path of a tilted helix is defined in the layer surface 18, creating a series of channel loops 32. In this example each of the loops 32 is elliptical in shape, it being understood that the individual loops are not closed shapes because they are portions along a continuous helical pattern. Collectively, the channel loops 32 define a path for placement of a segment of conductor which corresponds to a first row of coiled conductor. The loops may have shapes more complex than simple elliptical shapes in order to define or accommodate modulations and other variations in a desired conductor path. As illustrated, one or more of the loops 32 of the channel 30 may extend into the shoulder region 26. The channel 30 is cut or otherwise formed in the cylindrical outer surface 18 so that it extends a predetermined depth, d, into the layer 14 to define a conductor path. The actual depth of a portion of the channel, which is below the outer surface 18, may be equal to all or part of the thickness of the conductor to be placed therein, so that the conductor may be partly or entirely positioned within the channel 30.

About the surface 18 the path defined by the channel 30 continues along and within a closed cylindrical plane 18a (see FIG. 1I) defined by the outer surface 18, into the shoulder region 26. However, the portions of the channel 30 formed in the shoulder region 26 further continue along a path passing through and outside of the plane 18a. That is, the portion of the channel in the shoulder region 26 includes a transition ramp that extends from the shoulder surface 28 to a variable depth, e.g., ranging from a maximum depth 2d (within the closed plane 18a) to a minimum depth d at or outside of the closed plane 18a. Variation in the channel depth in the shoulder region effects a continual transition in the channel 30, from a position at one level (e.g., a depth d below the surface 18) in the layer 14 to another level in the shoulder region 26 which corresponds to the intended depth of a yet-to-be-formed channel in a next of the layers 14 of insulator to be placed about the layer 14 after conductor is positioned in the channel 30.

Figure 1I:
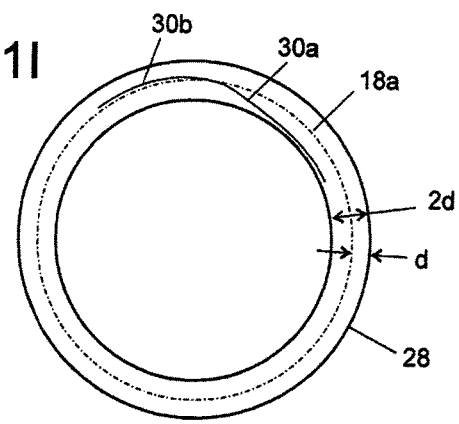

FIG. 1I is a view taken along the portion 30b of the channel 30 formed in the shoulder region, with the position of the cylindrical plane 18a shown in phantom lines. The channel depth in the shoulder region 26, with respect to the surface 28, ranges from d to 2d. The channel depth is indicated in the figure by illustrating the position of the deepest portion of the channel 30 in the shoulder region relative to the shoulder surface 28. A portion 30a of the channel 30 in the shoulder region, like the portion of the channel 30 formed in the outer surface 18, extends below the plane 18a. Another portion 30b of the channel 30 in the shoulder region extends above the plane 18a to a smaller the depth, d, below the shoulder surface 28 and may continue along the surface 28 at the depth, d, to the transition 29.

A feature shown in FIG. 1C is the formation of two paths, i.e., a channel fork, wherein the channel 30b extends along two different directions. As the channel depth decreases in the shoulder region, the channel bifurcates into a first path 31 that continues along the surface 28 to the transition 29 and a second path 33 that continues in a direction away from the transition 29. With this arrangement, after a conductor is placed in the portion 30a of the channel, the conductor may be positioned along the second path 33 in the channel portion 30b until the channel for the next coil row is formed.

Still referring to FIG. 1C, a winding process begins with positioning a spool 34 of conductor 38 at a first of the end regions 22. The spooled conductor has a continuous length of sufficient distance, end to end, to turn conductor through all of the channel loops 32 of the coil 10, thereby defining a series of conductor loops 36 in every one of the concentric coil rows in a splice-free manner. In this regard, reference to a conductor as splice-free means that, although a conductor segment of given length can be formed of multiple, connected sub-segments, a splice-free conductor is one in which there are no discrete connections effecting continuity along the length. This is typically because the entire length of the conductor has been initially formed and then preserved as one body having an uninterrupted and continuous length. By way of example, a filament may be extruded to at least the given length. A splice-free conductor is not one formed from multiple segments which have been electrically separate from one another prior or during installation in a conductor assembly (such as the assembly 10) and then have been coupled together (e.g., such as by mechanical means or by soldering or by welding) and thereby characterized by one or more detectable junctions that provide for electrical continuity along the given length. Rather, a splice-free conductor segment of given length is formed as a single unitary body without requiring during formation of the assembly any connection among smaller lengths thereof to effect continuity. In the case of multifilament conductor, a splice-free multifilament conductor segment of given length is also one which is formed as a single unitary body without requiring during formation of the assembly any connection among smaller lengths thereof to effect continuity. Notwithstanding the foregoing, the term segment, used in the context of a splice-free conductor of given length, may refer to one or more portions of the length or the entire length.

A first end 42 of the conductor 38 is placed in a fixed manner near the end 22 of the layer 14 and a first segment 50 of the conductor 38 is positioned in the channel 30. The conductor segment 50 is shown after generating all of the loops 36 in the coil core row 46, i.e., a first helical row of elliptical conductor loops 36 which is formed in the channel 30 on the layer 14.

Figure 1J:
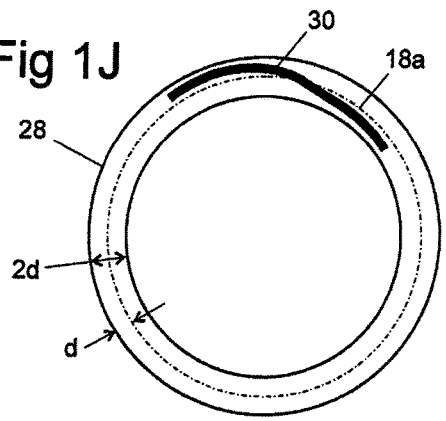

With the first segment 50 of conductor 38 fully placed in the channel portion 30a and continuing along the channel portion 30b, the conductor follows the second path 33 on the shoulder portion 28 with the spool 34 having been mounted on the mandrel 16 at the coil end 24. The placement of the conductor 38 in the path 33 and positioning of the spool 34 on the mandrel allow the conductor on the spool to remain attached to the conductor segment 50 while a next composite layer is formed and tooled to generate another level of channel. By way of example, the mandrel may be turned with the spool attached thereto in order to shape a regular cylindrical surface of the next composite layer and cut the channel. Once the next level of channels is formed, the conductor placed in the path 33 is removed and placed in the first path 31 to continue the winding process along the next channel in a direction from the coil end 24 toward the coil end 22. FIG. 1J provides a view of the conductor positioned in the portions 30a and 30b of the channel in the shoulder region 26, i.e., along the path 31, showing the conductor transitioning from a channel depth, relative to the outer surface 28, from 2d to d.

Placement of the conductor in the path 31 effects a 180 degree turn of the conductor 38 about the end 24 in order to position the conductor for insertion in another channel in order to form a second coil row. Accordingly, FIG. 1D illustrates a layer 56 of composite material formed over the core row 46 and layer 14, after having been cured and machined to form a regular cylindrical shape. The layer 56 includes a machined outer surface 62 in the shape of a regular cylinder into which a second channel 66 is machined. The layer 56 further includes a shoulder region 26 adjacent the coil end 22 and having features as described for the shoulder 26 which forms part of the layer 14, i.e., being twice the thickness of the portion of the layer 56 within the outer surface 62, and having a cylindrical outer shoulder surface 28. The channel 66 is formed, e.g., by machining, in the surfaces 62 and 28 to define a second helical path for receiving a second segment 52 of conductor.

When the layer 56 is turned, e.g., on a lathe or CNC machine, the spool 34 and associated conductor 38, being attached to the mandrel 16, turn with the layer 56 as the channel 66 is machined therein. As described with regard to the layer 14, the shoulder region 26 of the layer 56 may be defined with an abrupt, step-like transition 29 between the two surfaces 62 and 28 or the transition between the surfaces 62 and 28 may be gradual, along a sloped surface formed between the surfaces 62 and 28. Also, as described for the shoulder of the layer 14 in FIG. 1I, the channel 66 includes a portion 66b, analogous to the portion 30b, formed in the shoulder region, i.e., initially along a cylindrical plane extending from the surface 62 and extending toward the shoulder surface 28. The channel depth in the shoulder region 26, with respect to the surface 28, ranges from d to 2d as discussed with respect to FIG. 1I. The channel depth is indicated in the figure by illustrating the position of the deepest portion of the channel 30 in the shoulder region relative to the shoulder surface 28. The portion 66a of the channel extends from a depth 2d below the outer surface 28 of the layer 56 up to a depth of about 1d below the outer surface and may continue along the surface 28 at the depth, d, to the transition 29. Also as described with respect to the layer 14, the portion 66b includes two paths wherein the channel 66b extends along two different directions, one of the paths 31 continuing to the transition 29 and the other path 33 continuing in a direction away from the transition 29 so that the conductor may be initially placed in the path 33 and then, after channels for the next coil row are formed, be placed in the path 31.

FIG. 1E illustrates the partially fabricated coil 10 having the segment 52 of conductor 38 placed in the channel 66 to provide a second helical coil row 70. Both the channel 66 (FIG. 1D) and the coil row 70 are helical, with the channel 66 comprising elliptical loops 72 and the row 70 comprising elliptical loops 74 of conductor 38. The tilt angle of the channel and conductor loops 72 and 74 is opposite the tilt angle of the elliptical channel and conductor loops 32 and 36 of the coil core row 46. Pre-definition, e.g., by machining the channel 66, of the coil path for the second coil row 70, enables fixed placement of the conductor segment 52 along the curved surface 62 of the cylindrically shaped layer 56. This arrangement avoids slippage and minimizes other forms of movement of the conductor length as it extends beyond the core row 46. Similarly, when coil rows of other geometries are formed, e.g., in a race track pattern, the rows may be formed over intermediate layers of composite material in which one or more channels are formed to define and stabilize a wire path. This is an alternative geometric arrangement of conductor segments to that of a wire pattern wherein rows of circular-shaped insulated wires are nested in grooves formed by underlying rows of other circular-shaped insulated wires resulting, for example, in a pyramid-shaped slope along the edges. Also, as seen in FIG. 1E, with the segment 52 wound along the channel 66, the spool 34 is next positioned on the mandrel 16 adjacent the coil end 22, with a portion of the conductor 38 positioned in the path 33 while the next layer of insulator is formed and a channel is formed therein.

A series of additional helical coil rows 12 are formed over the rows 46 and 70. Initially with the conductor 38 extending from the segment 52 at an end 22 of the layer 56, a first in a series of additional insulator layers 76 and a first in a series of additional coil rows 12 are formed, and the alternating sequence proceeds in a manner similar to that described for forming the initial sequence of the composite layer 14, the coil core row 46, the composite layer 56 and the coil row 70. The spool is alternately affixed to different coil ends 22, 24 while each next insulator layer 76 is fabricated with a channel therein. In other embodiments, the insulator layers 14, 56, 76, may be pre-fabricated, with channels formed along the surfaces, and positioned over the prior-positioned layers. The pre-fabricated layers may be slid over one another or may be assembled from components having, for example, a clam-shell configuration, wherein each layer is formed of two components which, when placed together, form a tubular shape. FIG. 1F illustrates passage of the conductor along a channel formed in a shoulder 26 across the transition 29 and into a channel, e.g., the channel 66, to begin a next coil row.

The described fabrication sequence enables formation of splice-free magnetic coils in a helical, e.g., double helix, configuration. With this sequence it is no longer necessary to route the conductor from a lower insulative level radially upward to protrude out from the lower level in a region where the next insulative level is to be formed. In the past this arrangement posed a difficulty of having to form the next insulative layer about the very region from which the conductor protruded. Moreover, it has been necessary to tool that region without damaging the conductor in order to form a channel which continues the conductor path. Consequently, a greater amount of manual tooling has been necessary to assemble coils. On the other hand, the fabrication sequences disclosed herein may be fully automated with conventional equipment such as a CNC machine. Moreover, the ability to build sequential coils rows with splice-free conductor adds reliability and reduces potential concerns relating to solder joints and contact resistances.

Figure 1K:
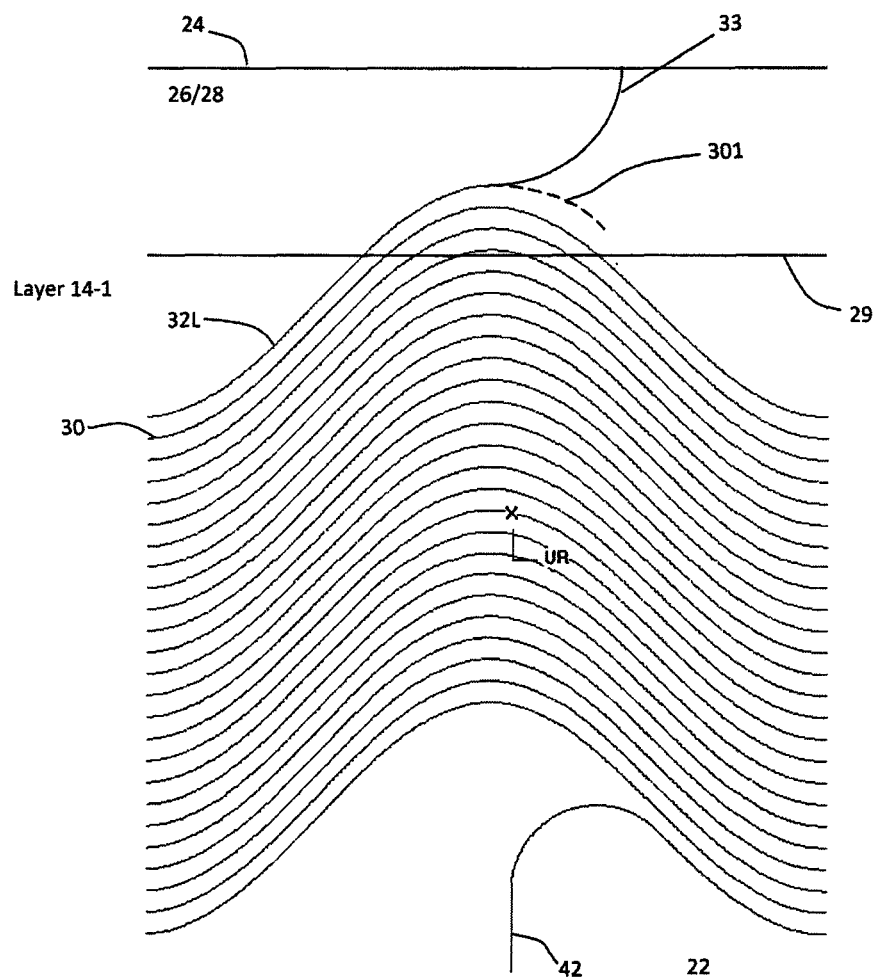
Figure 1L:
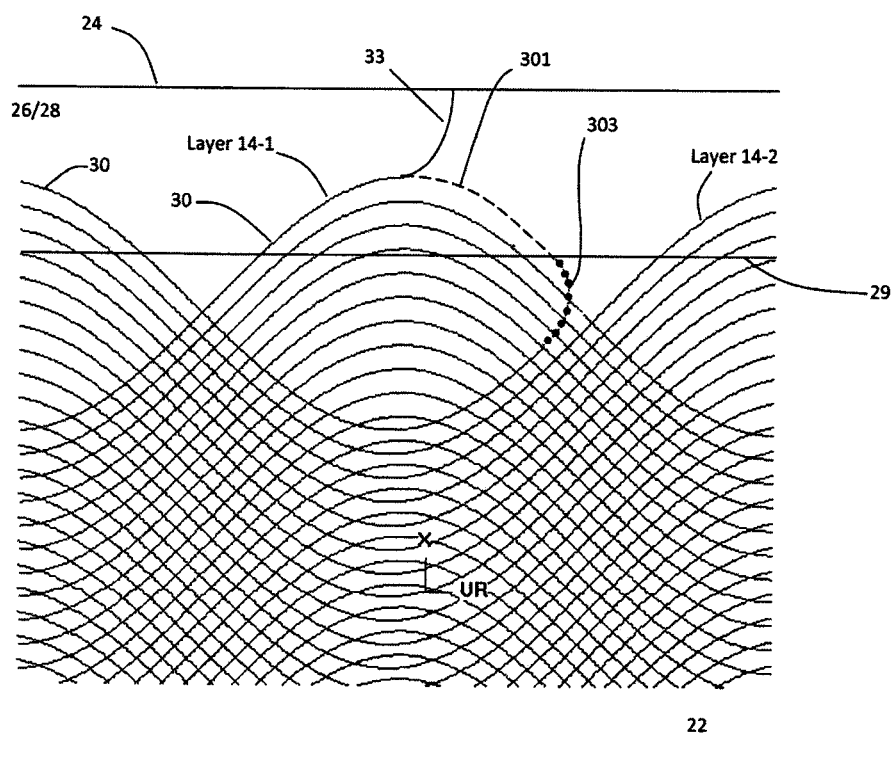
Figure 1M:
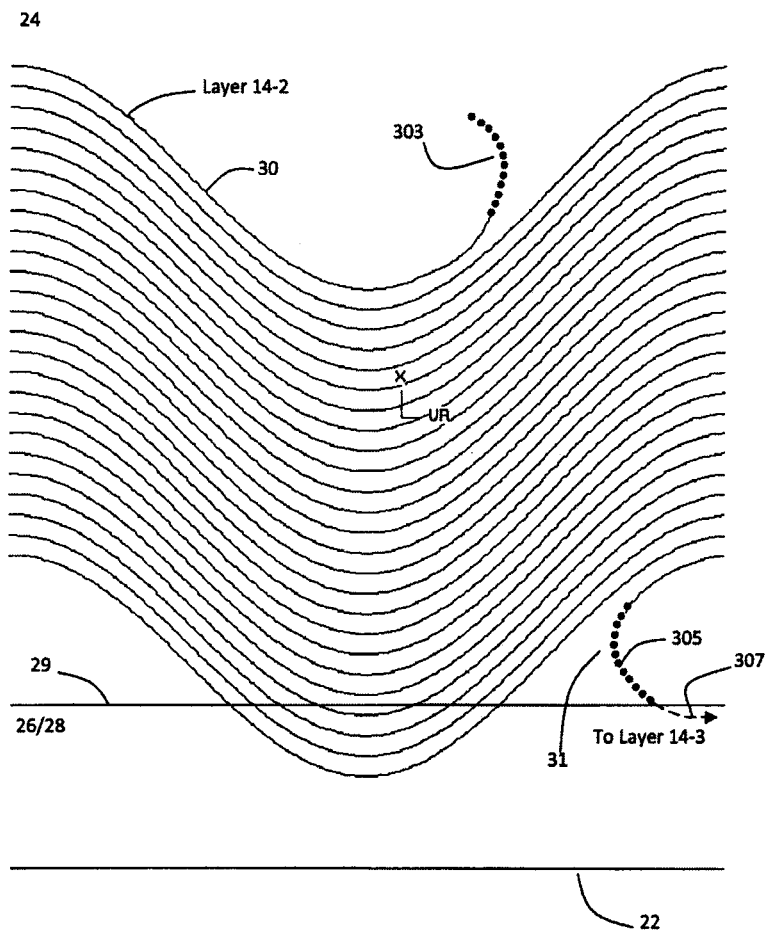

FIGS. 1K, 1L and 1M further illustrate features associated with forming a splice-free coil 10 according to an embodiment of the invention wherein rerouting of the channels and associated conductor occurs through three layers 14-1, 14-2 and 14-3. The FIGS. 1K, 1L and 1M present 360 degree views of layers as though the layer surfaces are transformed to a plane surface, sometimes referred to as "unrolled" views. That is, these views are generated as though the cylindrical shaped surface of each layer containing a channel 30 is cut open and laid along a plane to provide a two dimensional or plan view in which the abscissa UR represents the arc length over the cylinder surface and the ordinate X represents the axial direction.

FIG. 1K shows a view of an innermost layer 14-1 which may correspond to the layer 18 of FIGS. 1B and 1C. The channel 30 in layer 14-1 receives a first end 42 of the conductor 38 which is placed in a fixed manner near the end 22 of the layer 14-1. In the last loop 32L, opposite to the first end 22, the conductor channel 30 ramps up through the plane 18a (see FIGS. 1I and 1J) in the shoulder 26 to reach the level of the next layer 14-2. Channel portion 301, illustrated with phantom lines, corresponds to the portion of the channel 30 which performs this ramping transition.

FIG. 1L shows the channel and conductor transition between Layer 14-1 and Layer 14-2. At the end of the ramp portion 301 which extends out to the Layer 14-2, the conductor channel follows a smooth arc along the plane of the layer surface, e.g., cylindrical surface 62 shown in FIG. 1D, to conform with the initial winding direction of Layer 14-2. This first transition arc 303 (shown with dotted lines) in layer 14-2 passes above and across the turns of Layer 14-1.

FIG. 1M shows the Layer 14-2 with the first transition arc 303 near the coil end 24 and a second transition arc 305 (also shown with dotted lines) near the coil end 22 and in a shoulder 26. Following the second arc 305 is a channel portion 307, also illustrated with phantom lines, in which the channel ramps up through another plane, e.g., analogous to the plane 18a, in a shoulder 26 to reach the level of the next layer 14-3.

The term "conductor" as used herein refers to a string-like piece or filament of relatively rigid or flexible material, commonly referred to as cable or wire, being of the type comprising either a single conductive strand or multiple ones of such strands grouped together as one functional conductive path. The term multi-strand conductor refers to such a conductor formed as a single identifiable unit and composed of multiple conductive strands which are twisted, woven, braided or intertwined with one another to form an identifiable single unit of wire. Reference to one multi-strand conductor means application of the single identifiable unit as one functional unit and excludes having multiple ones of the individual functional units grouped together functionally when the multiple ones are not twisted, woven, braided or intertwined with one another. As used herein, multi-strand conductor only refers to arrangements wherein the multiple strands are twisted, woven, braided or intertwined with one another to form the single unit. According to the invention, multi-strand conductor may take the form of conductor that embodies a circular or a non-circular contour in cross section.

The term cross section refers to a section of a feature, e.g., a conductor or an aperture or a coil, taken along a plane which is transverse to a definable axis through which the feature extends. If the axis is curvilinear about a point of interest, the plane is understood to be transverse to the direction of a vector which is tangent to the direction of the axis at the point of interest.

With channels such as the channels 66 formed in all of the rows, e.g., core coil row 46, coil row 70 and the series of additional coil rows 12, a structure is provided which can minimize or eliminate conductor movement throughout the entire coil 10. In superconductor applications, such enhanced constraint provided by channels formed in an insulative layer, e.g., a composite material sequentially formed as conductor is positioned in concentric rows. Provision of a channel having a profile dimensioned within a close tolerance to the width or diameter of the superconductor can prevent micron or sub-micron movement of the conductor. Such movement could generate sufficient heat to cause part of the superconducting coil to transition from a superconducting state to a normal state, referred to as a quench.

In applications for normal conducting magnets, provision of a channel having a profile dimensioned within a close tolerance to the width or diameter of the conductor can precisely define a path for the conductor. This may be especially beneficial when different rows of non-insulated conductor segment, e.g., coil rows, are spaced apart from one another such that the path of an outer row is not determined by the path of an adjacent inner row. In the illustrated embodiments the channels 30 and 66 have provided paths for a helical winding having a sinusoidal modulation of period 2 pi about each channel loop 32, as now explained. However, the invention provides further benefits when the conductor loops are modified to include higher frequency modulation components. The resulting channel and conductor loops are more complex than the open ellipsoid shapes of the illustrated loops 32, 36. Such modulated channel paths are useful for defining conductor patterns which very precisely generate fields with quadrupole, sextupole or higher order field components in accord with simulations.

Figure 2:
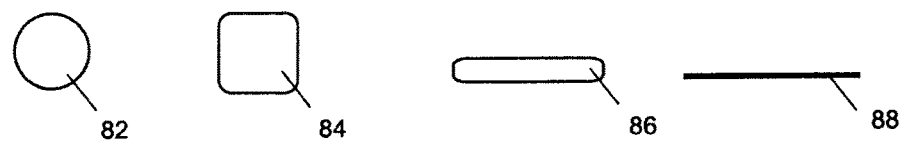
FIG. 2 illustrates, in cross section, several shapes of conductor which may be used in the coil shown in FIG. 1.

Numerous cross sectional channel shapes and conductor shapes may be used in constructing the coil 10. The conductor 38 may be a solid core or a multi-strand conductor. As shown in FIG. 2 the conductor 38 may have a circular shape 82 in cross section, a square shape 84 in cross section, a rectangular shape 86 in cross section or a relatively flat profile, tape-like form 88. The illustration of such shapes is only proximate, it being understood that shapes will vary considerably from regular geometries. For example, square-shaped or rectangular-shaped conductors will have rounded corners as shown in the figures. A multi-strand conductor with a square or rectangular cross section 84 may not have flat side walls, and can be produced by running a cable which is initially circular-shaped in cross section through a forming die which conforms the cross sectional shape to a desired profile. A multi-strand conductor having the rectangular shape 86 shown in cross section in FIG. 2 may be a braided copper conductor or a Rutherford type cable used for superconductor applications. The conductor 88 may be, for example, a YBCO-based high temperature superconductor wire having a tape-like profile with a width dimension in a range, for example, between 2 mm and 5 mm, and a thickness in the range, for example, of 0.09 mm to 0.3 mm.

Generally, embodiments of the invention now provide a channel, such as one of the channels 30 or 66, in each of multiple conductor rows of a coil, having a profile suitable for accommodating a conductor of desired cross sectional shape, such as one of the exemplary shapes shown in FIG. 2. Providing such a channel may result in one or more additional benefits depending on the corresponding channel profile.

For example, with a conductor having a circular cross section, the channel may have a corresponding circular shape with a width sized very close to or the same as the conductor diameter, and a depth of approximately one half the conductor diameter. With this arrangement, and a subsequent overcoat of another layer of composite, such as wherein one of the layers 76 overcoats the conductor segment 52 and portions of the layer 56, it is possible to precisely define placement of the conductor segments and constrain the segments from movement in the presence of high magnetic fields. This placement can be totally independent of conductor placement in an underlying coil row.

Figure 3A:
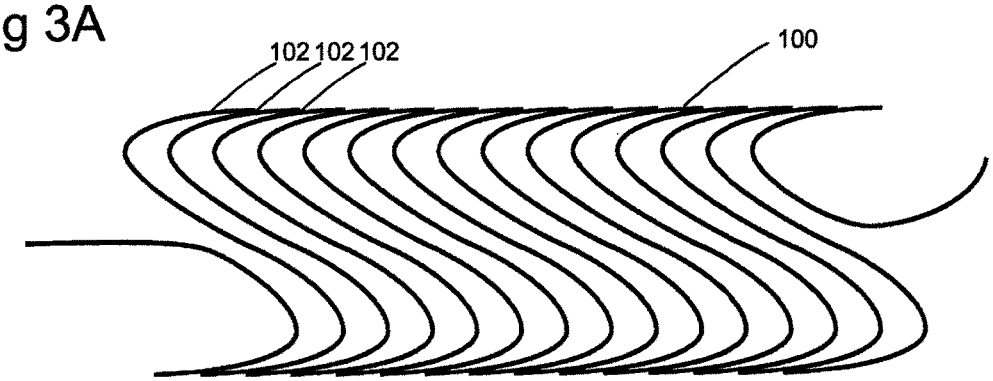
FIGS. 3A and 3B illustrate exemplary paths of segments of coil conductor according to an embodiment of the invention.
Figure 8A:
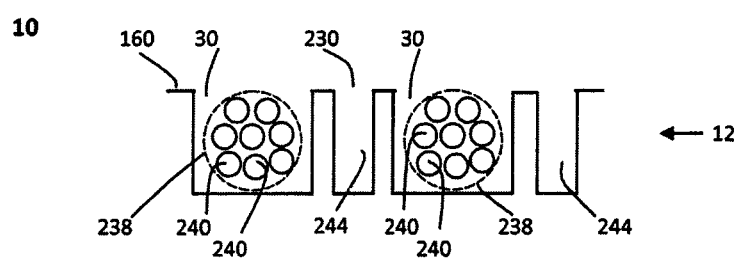
FIGS. 8A and 8B are cross sectional views of embodiments of a coil including cooling channels and FIGS. 8C-1-8C-4 and 8D-1-8D-3 illustrate alternate configurations of conductor channels.
Figure 8B:
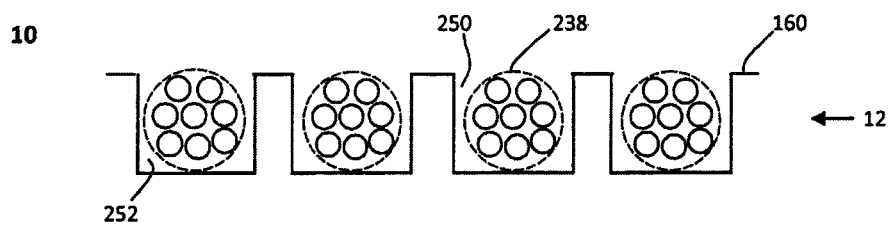
Figures 1, 8C:
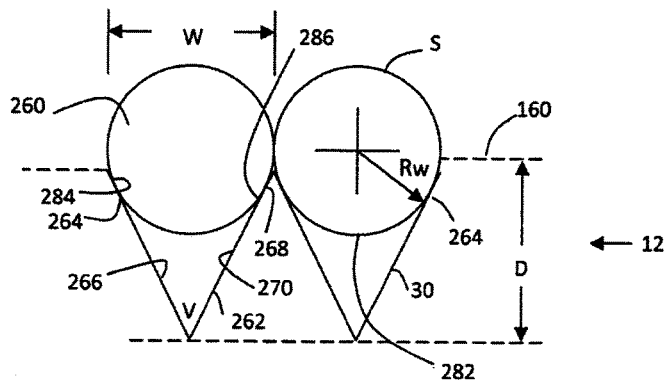
Figures 2, 8C:
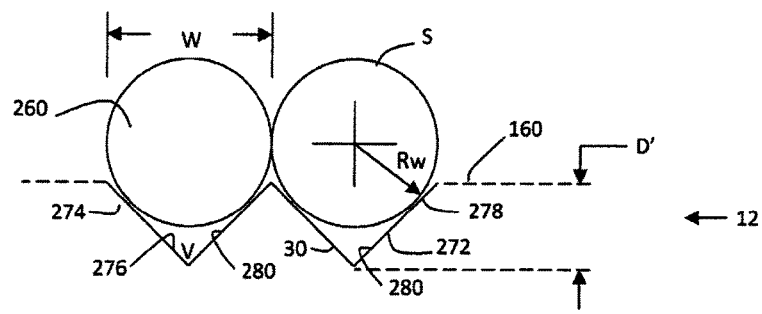

With reference to FIG. 3A, there is shown an exemplary conductor segment 100 following a helical path and comprising, relative to the loops 36 of FIG. 1, a higher frequency sinusoidal component in each loop 102 thereof. Multiple ones of the illustrated segment may be used to form the coil 10 with each segment positioned in a different coil row. Specifically, in a double helix embodiment, such a configuration would be composed of the segment 100 and a segment 110, shown in FIG. 3B, which has an opposite tilt relative to the segment 100. Multiple pairs of the segments 100 and 110 may be built up from a core in an alternating sequence similar to the manner described with respect to FIG. 1. Embodiments of the invention are not limited to the afore-described double helix configuration.

As used herein, the term coil and the adjective helical refer to but are not limited to regular helical patterns of conductor, such as illustrated in FIG. 1. A simple spiral pattern in three-dimensional space is generated in accord with the relationships $$X(\theta)=[h/(2*\pi)]\theta$$

$$Y(\theta)=R\cos(\theta)$$

$$Z(\theta)=R\sin(\theta)$$

wherein X is along a coordinate parallel with the axial direction and Y and Z are along directions transverse thereto and orthogonal to one another. $\theta$ is the azimuthal angle measured in a Y-Z plane transverse to the X-axis. The parameter h defines the advance per turn in an axial direction (X). R is the aperture of the winding pattern which, for a regular shape, corresponds to a radial distance from an axis of symmetry to a point on the curve.

Figures 3, 8C:
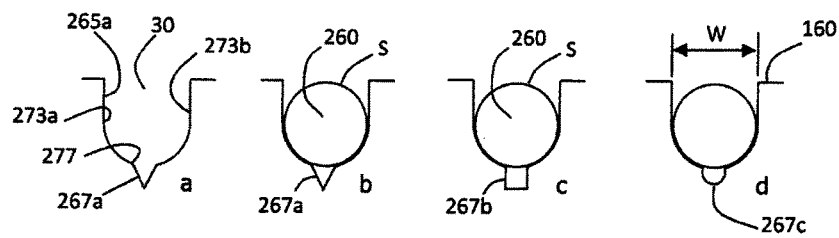

The three-dimensional space curve describing the paths of the regular helical geometries for the segments 50 and 52 (n=1), and for the segments 100 and 110 (n=2) are generated in accord with the relationship $$X(\theta)=[h/(2*\pi)]\theta \pm A\sin(n\theta)$$

$$Y(\theta)=R\cos(\theta)$$

$$Z(\theta)=R\sin(\theta)$$

wherein alternating ones of the coil rows 12 follow paths for which the A sin(n$\theta$) term is added or subtracted. Thus term A sin(n$\theta$), added to the X($\theta$) equation, imparts for n=1 a positive or a negative tilt to each of the turns relative to the YZ-plane, in proportion to the magnitude and sign of the term A. For n=2 or higher, the term A sin(n$\theta$) introduces a modulation, i.e., a sinusoidal variation, in each 360 degree turn of the curve about the axis. For n=1, the ellipsoidal shape of the segments 50 and 52 is imparted to each turn as shown in the examples of FIG. 1. The pattern wherein n=2 is shown in FIG. 3. For higher values of n, higher frequency sinusoidal components modulate each helical turn in a channel or corresponding conductor row.

Still, more generally, a three-dimensional space curve may be generated in accord with the relationship $$X(\theta)=[h/(2*\pi)]\theta \pm \Sigma A_n \sin(n\theta)$$

$$Y(\theta)=R \cos(\theta)$$

$$Z(\theta)=R \sin(\theta)$$

wherein a complex modulation of the channel and the conductor can comprise multiple different sinusoidal frequency components, each component having an amplitude $A_n$. In this context the term coil and the adjective helix includes a variety of spiral-like shapes which result from superposition of one or more functions, e.g., $A_n \sin(n\theta)$ on a spiral curve generated in accord with $X(\theta)=[h/(2\pi)]\theta$. Other trigonometric or numerical expressions may be used in lieu of the term $\Sigma A_n \sin(n\theta)$ to define the channel path and the conductor path.

According to an exemplary design and fabrication sequence, to construct a coil according to the invention an initial coil geometry for a desired coil design is first defined. This will be a function of numerous parameters including the shape of the conductor cross section, conductor dimensions, and the number of rows of conductor in the coil. Subsequently, for each defined layer of composite material, e.g., along a cylindrically shaped surface of a layer 76, a corresponding channel geometry is generated to receive the conductor. By way of example, G code instructions may be generated, based in part on the conductor path trajectory, $X(\theta)$, $Y(\theta)$, $Z(\theta)$, for application in a CNC machine to tool an appropriate channel profile and channel path in the composite material. The tooling can be accomplished with desired precision so that placement of segments of conductor to form each coil row in each composite layer assures positioning of all segments with sufficient precision as to assure that the fields generated from the combination of row patterns corresponds closely with the fields modeled for the coil design. With this methodology, numerous new combinations of channel profiles and conductor cross sectional shapes can be formed to create coil designs.

In still other embodiments the channel profile may be generated for a conductor path which varies in angle or elevation relative to the surface of the insulative layer in which the channel is formed. See, for example, the illustrations of FIGS. 4A, 4B and 4C wherein an elliptical-shaped loop 120 of square or rectangular shaped conductor 122 is shown positioned along a cylindrical shape 126 in a partial view of an insulative layer 130. The shape 126, which corresponds to the conductor loop 36 of FIG. 1C or the conductor loop 74 of FIG. 1E, is positioned about an axis 128 of symmetry. Portions of the shape 126 correspond to exposed surface portions of the insulative layer 130 after a channel is formed therein for placement of the conductor. Other portions of the illustrated cylindrical shape 126 are not along a surface which would normally be viewable during fabrication, but are shown to better illustrate orientation of various portions of the loop 120 with respect to the shape 126.

Figure 4A:
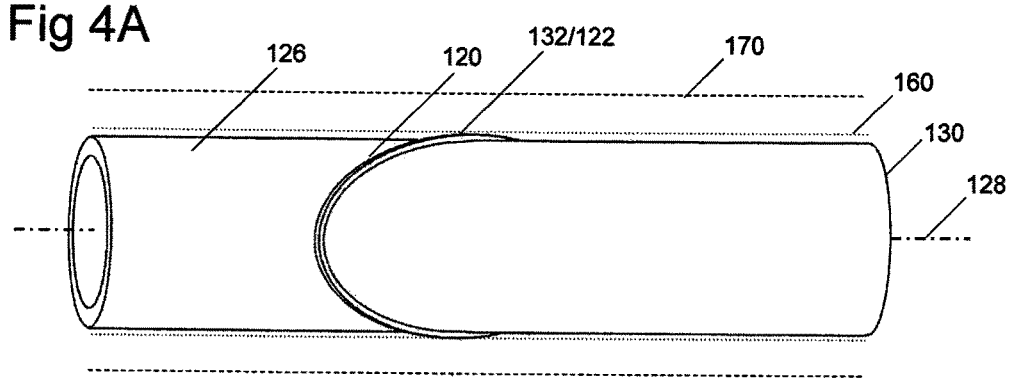
FIGS. 4A-4C are perspective views illustrating an exemplary loop of conductor shaped and positioned according to an embodiment of the invention.
Figure 5A:
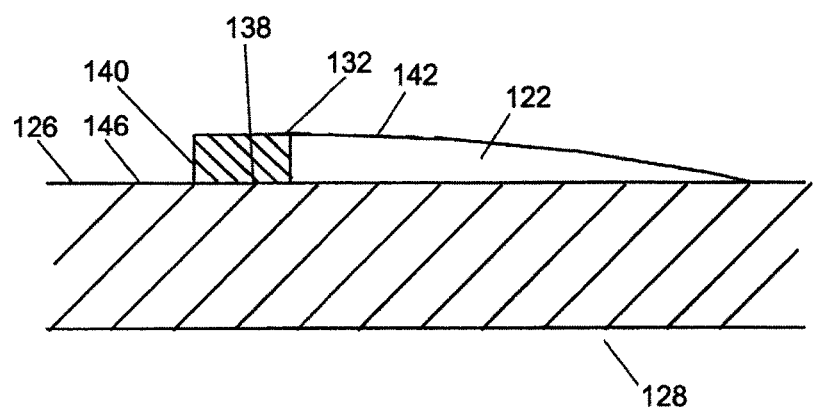
FIGS. 5A-5C provide views in cross section of the conductor as positioned in FIGS. 4A-4C.

FIGS. 4A and 5A illustrate the portion 132 of the conductor along a relatively straight portion of the loop 120 having the largest radius of curvature. The conductor portion 132 is positioned at the top of FIG. 4A to illustrate that along this relatively straight portion of the loop 120 a lower surface 138 of the conductor is substantially conformal with the adjacent portions of the cylindrical shape 126. First and second opposing sidewalls 140 and 142 of the rectangular shaped conductor are each oriented in a direction substantially transverse to the cylindrical shape 126. More generally, noting that the conductor 122 may be solid core or multi-strand conductor that is only approximately rectangular, at least portions of the sidewalls 140 and 142 are substantially flat surfaces parallel to one another, i.e., oriented in a direction substantially transverse to an adjoining portion of the cylindrical shape 126. See FIG. 5A which illustrates in cross section a view taken along a first plane aligned with the axis 128 and passing through the portion 132 of the conductor loop 120 having the largest radius of curvature. Along the first plane the conductor lower surface 138 is parallel with an adjoining portion 146 of the cylindrical shape 126.

Figure 4B:
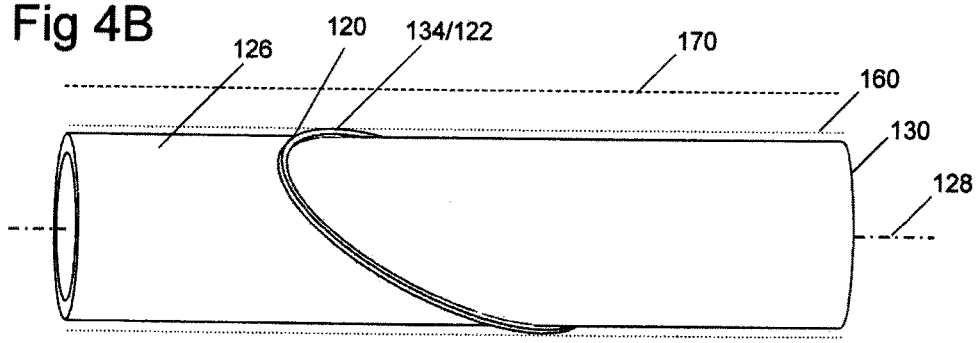
Figure 5B:
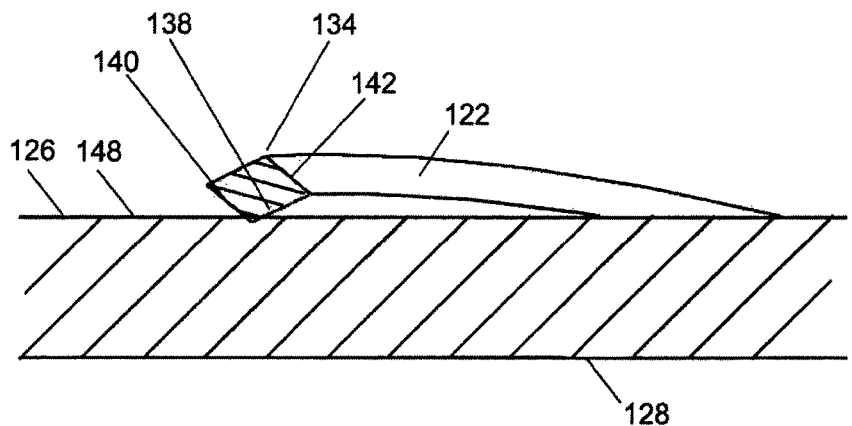

FIGS. 4B and 5B illustrate the portion 134 of the conductor along the portion of the loop 120 having the an intermediate radius of curvature, relative to the maximum radius of curvature along the portion 132 of the loop 120 and a smallest radius of curvature along the loop. In the view of FIG. 4B, the cylindrical shape 126 and the conductor 122 are rotated about the axis 128 relative to the view of FIG. 4A, so that the conductor portion 134, having the intermediate radius of curvature, is positioned at the top of FIG. 4B. In this view it can be seen that the conductor sidewalls 140 and 142 are canted and not transverse, i.e., not at right angles, with respect to any adjoining portion of the cylindrical shape 126. See also FIG. 5B which illustrates in cross section a view taken along a second plane aligned with the axis 128 and passing through the portion 134 of the conductor loop 120 having the intermediate radius of curvature. Along the second plane the conductor lower surface 138 is not parallel with respect to the adjoining portion 148 of the cylindrical shape 126.

Figure 4C:
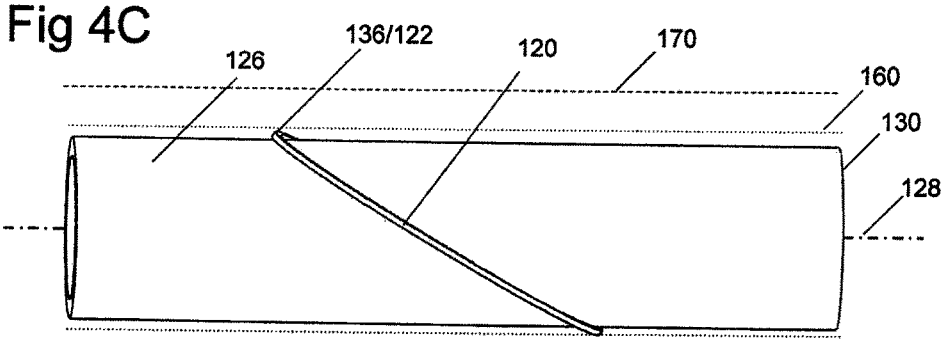
Figure 5C:
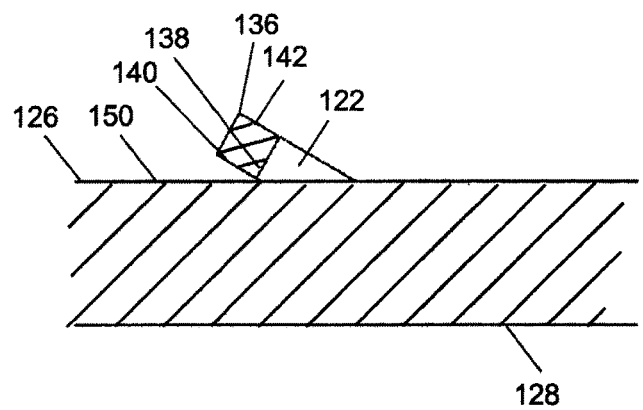

FIG. 4C illustrates the portion 136 of the conductor along the portion of the loop 120 having the smallest radius of curvature. In the view of FIG. 4C, the cylindrical shape 126 and the conductor 122 have been further rotated about the axis 128 with respect to the positions shown in FIGS. 4A and 4B, so that the conductor portion 136 is positioned at the top of FIG. 4C. A feature of the conductor portion 136 is that the conductor side walls 140 and 142 are canted and not transverse with respect to adjoining portions of the cylindrical shape 126. See also FIG. 5C which illustrates in cross section a view taken along a third plane aligned with the axis 128 and passing through the portion 136 of the conductor loop 120 having the smallest radius of curvature. Along the third plane the conductor lower surface 138 is not parallel with respect to the adjoining portion 150 of the cylindrical shape 126. Along the cross section of the portion 136 corresponding to the smallest radius of curvature, the angle, at which each of the side walls 140 and 142 is canted relative to the adjoining portion 150 of the cylindrical shape 126, is greater than the angle at which the same side wall, along the portion 134, (corresponding to the intermediate radius of curvature) is canted relative to the there adjoining portion 148. Compare FIG. 5C to FIG. 5B.

FIGS. 4A, 4B and 4C also illustrate, with phantom lines, (i) a portion of a cylindrical shaped surface 160 of the insulative layer 130 in which a channel may be formed as described with respect to FIG. 1, and (ii) another cylindrical shaped surface 170 corresponding to an arbitrary surface, such as an exposed outer surface, along the coil 10 of FIG.

1. Both of the surfaces 160 and 170 share symmetry with the shape 126 about the axis 128. The conductor 122 is an example shape of the conductor 38 shown in FIG. 1, and may be configured into multiple continuous loops according to the loop 120, to form the loops 36 in any one more of the coil rows of the coil 10. With either of the surfaces 160 or 170 serving as a reference, from the foregoing description it is also apparent that the conductor side walls 140 and 142 and the conductor lower surface 138, and the upper surface 172 of the conductor 122, all vary in angle, with respect to both the layer surface 160 and the surface 170 as the radius of curvature of the loop 120 and position along the layer 130 vary. Generally, with respect to any such reference surface on a coil comprising the conductor loop 120, the angles of the side walls 140 and 142 vary as a function of radius of curvature and position.

FIGS. 6A-6C and FIGS. 7A-7C each illustrate features of an elliptical-shaped loop 190 of a channel 200 formed in the insulative layer 130 for placement of the conductor loop 120 therein. The channel 200 is of an exemplary square or rectangular shaped profile and is positioned along the cylindrical shaped outer surface 160 of the insulative layer 130. The channel is part of an embodiment of a coil as described for the channels 30 and 66 (see FIG. 1) wherein the insulative layer is formed on a core and machined to form the channels therein. The channel 200 includes a pair of opposing side walls 204 and 206 and a lower surface 208 extending between the side walls for receiving the lower surface 138 of the conductor 122.

Figure 6A:
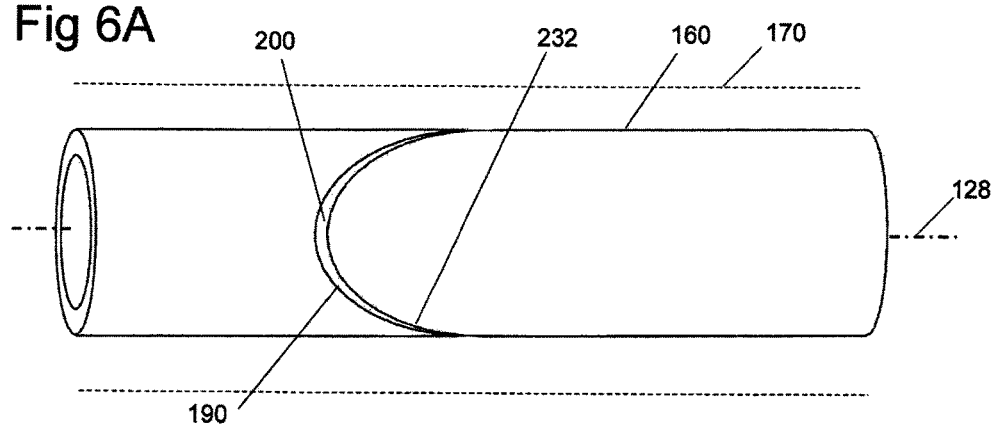
FIGS. 6A-6C are perspective views each illustrating features of an exemplary loop of a conductor channel at differing positions along an insulative layer.
Figure 7A:
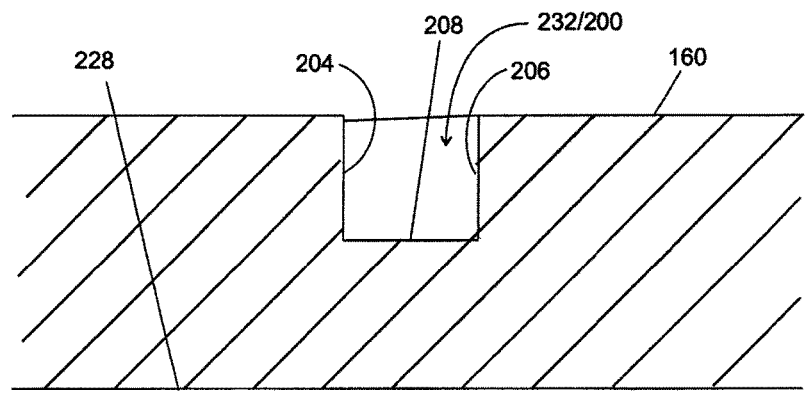
FIGS. 7A-7C illustrate in cross sectional views the conductor channel shown at various positions according to FIGS. 6A-6C.

FIGS. 6A and 7A illustrate the portion 232 of the loop 190 of the channel 200 adjoining the portion 132 of the conductor 122 (not shown), i.e., along a relatively straight portion of the loop 120 having the largest radius of curvature. The channel portion 232 is positioned at the top of FIGS. 6A and 7A. Along this relatively straight portion of the loop 190 the lower surface 208 of the channel is substantially parallel with adjacent portions of the cylindrical shaped surface 160 of the insulative layer 130. See FIG. 7A which illustrates in cross section a view taken along a first plane aligned with the axis 128 and passing through both the portion 132 of the conductor loop 120 and the channel portion 232. The opposing side walls 204 and 206 of the rectangular shaped channel portion 232 are each oriented in a direction substantially transverse to the cylindrical shaped surface 160.

Figure 6B:
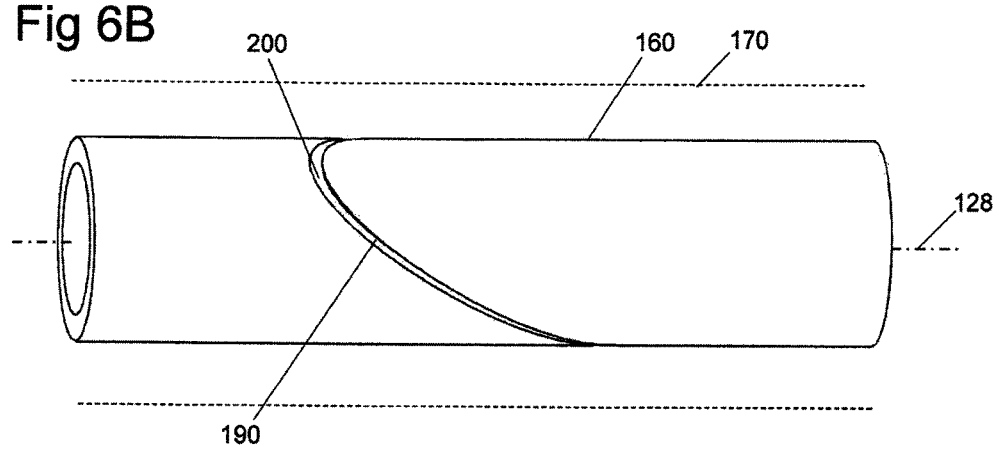
Figure 7B:
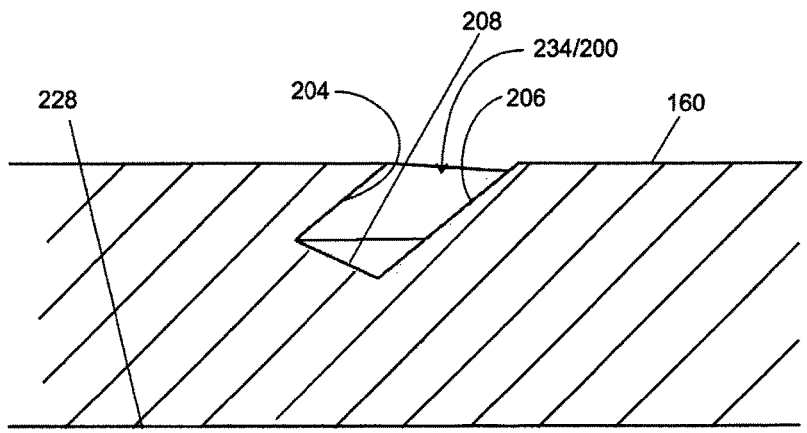

FIGS. 6B and 7B illustrate the portion 234 of the channel loop 190 adjoining the portion 134 of the conductor 122 (not shown), i.e., along the portion of the conductor loop 120 having an intermediate radius of curvature. The channel portion 234 has an intermediate radius of curvature relative to the maximum radius of curvature along the channel portion 232 and a smallest radius of curvature along the loop 190. In FIG. 6B the cylindrical shaped surface 160 and the loop 190 are rotated about the axis 128 relative to the view of FIG. 6A so that the channel portion 234, having the intermediate radius of curvature, is positioned at the top of FIG. 6B. The channel sidewalls 204 and 206 of the rectangular shaped channel portion 234 are canted and not transverse with respect to any adjacent portion of the cylindrical shaped surface 160. The lower surface 208 of the channel is not parallel with adjacent portions of the cylindrical shaped surface 160 of the insulative layer 130. See FIG. 7B which illustrates in cross section a view taken along a second plane aligned with the axis 128 and passing through both the portion 134 of the conductor loop 120 and the channel portion 234.

Figure 6C:
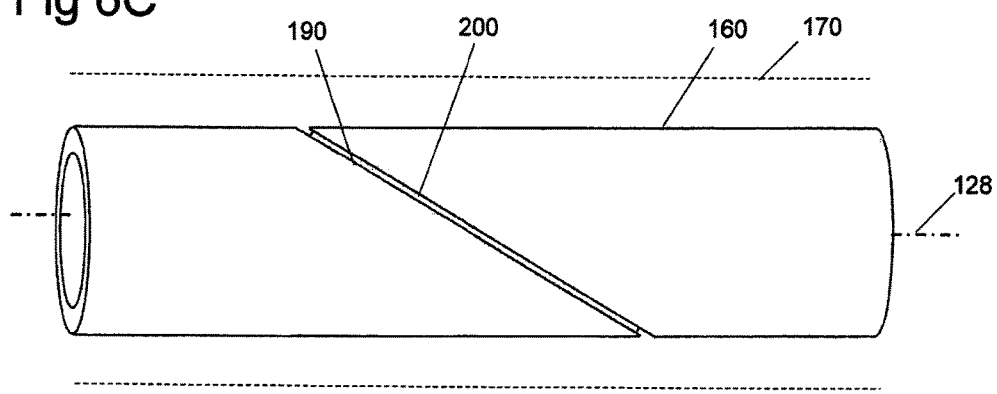
Figure 7C:
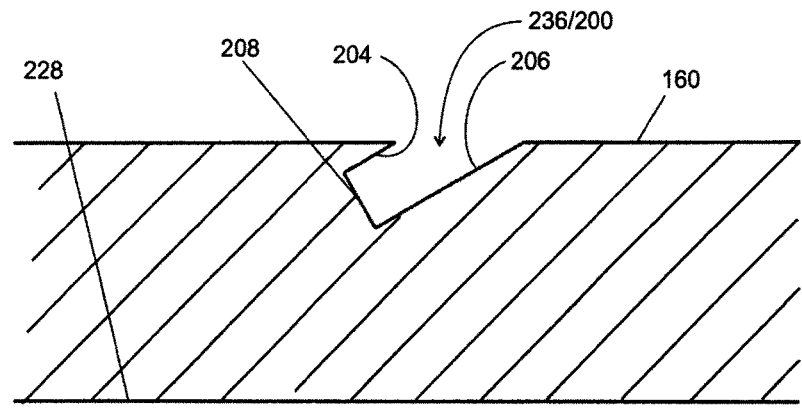

FIGS. 6C and 7C illustrate the portion 236 of the channel loop 190 adjoining the portion 136 of the conductor 122 (not shown), i.e., along the portion of the loop 120 having the smallest radius of curvature. The channel portion 236 has the smallest radius of curvature relative to the maximum and intermediate radii of curvature in the loop 190. The cylindrical shaped surface 160 and the loop 190 shown in FIG. 6C have been further rotated about the axis 128 with respect to the positions shown in FIGS. 6A and 6B so that the channel portion 236 is positioned at the top of FIG. 6C. A feature of the channel portion 236 is that the sidewalls 204 and 206 and the lower surface 208 are canted and not transverse with respect to adjoining portions of the cylindrical shaped surface 160. Moreover, along the channel portion 236, the angle, at which each of the sidewalls 204 and 206 and the lower surface 208, is canted relative to an adjacent portion of the cylindrical shaped surface 160, is greater than the angle at which the same sidewall is canted along the channel portion 234 relative to an adjacent portion of the cylindrical shaped surface 160. See FIG. 7C which illustrates in cross section a view taken along a third plane aligned with the axis 128 and passing through both the portion 136 of the conductor loop 120 and the channel portion 236.

From the above description it is apparent that provision of a channel in an insulative layer enables advantageous positioning of a conductor of varied shape along an insulative layer in a magnet coil. For conductors of arbitrary cross sectional shape, provision of channels in the insulative material on which a coil row is formed pre-defines a path for the conductor without dependency on any conductor provided in an underlying coil row. As shown in the illustrated embodiments, it is now possible to more fully utilize other wiring patterns without compromising reliability by separating all of the rows of conductor segments with insulative layers and pre-defining the wiring patterns with channels formed in the insulative layers. This is particularly advantageous for brittle conductors such as high temperature ceramic superconductors because positioning such material, e.g., $MgB_2$, can assure stability.

Formation of channels for positioning the conductor provides precise position and conductor stabilization while also isolating portions of the conductor from other portions of the conductor. The channel profile is not limited to round wire or cables. Other conductor shapes such as square or rectangular cross sections or tape can be used in conjunction with channels. The channel may be configured to match the cross sectional shape of the conductor. The conductor pattern and the corresponding channel path can be formed in a relatively tight helical configuration wherein h, the advance per turn in an axial direction, is so small that portions of the conductor in adjacent turns come into contact. In such embodiments the conductor has an insulative coating. The channels can accommodate square or rectangular cross sections, allowing optimization of current density relative to coil volume, this resulting in higher fields with less conductor length. To minimize deformation on conductor having rectangular cross sectional shape, the channels can be formed at a variable angle with respect to a central axis or reference surface. In such embodiments, the resulting field will differ from that which is generated for a conventional conductor of circular cross sectional shape, in part because a channel for a circular shaped conductor will not follow the same path as a channel which accommodates a rectangular shaped conductor. In other embodiments, channels with rectangular cross sectional shapes can be formed in a normal and invariant orientation with respect to the layer surface. In these embodiments the conductor may be conformed to the path in order to assume a more optimum current carrying capability. Generally, with the channel surface including a relatively flat portion extending along the channel path and in continual contact with a portion of the conductor, along multiple spaced-apart positions of the conductor path the angle of the relatively flat channel surface portion relative to an adjacent portion of the insulative layer surface in which the channel is formed is substantially invariant.

Certain embodiments of the invention have been described, but it is to be understood that channels according to the invention can be formed in a variety of shapes and in layers of various material types. These include metals, composites and ceramics. Channels may be formed by machining or other techniques, including molding, casting, etching, laser cutting, Another feature of the invention is that the position of a conductor as defined by the channel pre-determines the field "shape" and field quality (e.g., uniformity). The conductor path can be defined in the channels to achieve the theoretical optimum position of the entire conductor path. Achieving the theoretical positioning provides the optimum field quality in terms of the desired multipole orders with removal of systematic errors. The channels effectively minimize "random" errors by positioning conductors as close to the theoretically correct positions as possible. Accuracy of placement is only limited by precision of modern machining centers.

Stabilizing conductor in the channels prevents the conductor from movement caused by changes in temperature and Lorentz force. The provision of channels enables formation of reliable magnets on curvilinear axes. Absent provision of channels in all coil rows conductors are more prone to slip and create a "quench" in the magnet, leading to potential catastrophic destruction of the magnet.

For superconducting magnets, the channels provide the conductor with additional stability to mitigate movement when temperature cycling. Covering a positioned segment of conductor with an overlying layer of composite material provides additional adhesion and stability. Further, isolation of the conductor loops eliminates electrical shorts between turns for both insulated and for certain non insulated conductors. Addition of the overlying composite layer eliminates shorts from coil row to coil row.

The channels may also be designed to provide cooling paths around the conductor. Suitable cooling sources include liquid nitrogen, liquid helium and water, See FIG. 8A, a partial view in cross section of the coil 10 of FIG. 1. The multistrand conductor 238, comprising individual strands 240 and having an approximate circular shape in cross section, is an example embodiment of the conductor 38 shown in FIG. 1. A helically shaped cooling row channel 230 is formed separate and apart from the conductor channel 30 in which the exemplary multi-strand conductor 238 is placed to form each coil row. The figure shows two loops 244 of the cooling channel 230 interlaced between channel loops such as the loops 32 and 72 shown in FIGS. 1B and 1D, respectively. More generally, and not further illustrated, the cooling row channel 230 may be positioned in, above or below a conductor channel. If individual cooling channel loops 244 in the insulator, which form the channel 230, are placed between two coil rows, instead of in one coil row 12, then the channel 230, extending in parallel with two conductor channels, can facilitate cooling of conductor segments in two adjacent rows. As shown in FIG. 8A, individual loops 244 may be interlaced between pairs of the conductor channel loops 32 in each of the coil rows. In such embodiments the entire channel 230 can be used to flow liquid or gaseous coolant and the conductor channel can be shaped and sized to optimize conductor performance.

The partial view in cross section of the coil 10 shown in FIG. 8B illustrates that for other embodiments, a single rectangular shaped channel 250 in each coil row may accommodate both the conductor 238 and passages 252 for circulating a cooling fluid along the conductor 238. The channel 250 is shown in combination with the conductor 238 having a circular or elliptical—like shape in cross section, with the passages being the voids, i.e., spaces, between the channel and the conductor. Alternately, a rectangular shaped conductor may be sized substantially smaller than the channel and placed therein, or the combination of conductor and channel may have a complementary configuration, e.g., wherein the conductor in cross section is of a circular contour and the channel in cross section is of rectangular contour sized to receive the conductor. With such arrangements, the channel includes a path for flowing desired liquid coolant about the conductor. Further useful channel contours are now described, it being understood that these may be incorporated in the aforedescribed embodiments, such as shown in the other figures, by replacing channel shapes with those now illustrated.

Generally the expression "contour in cross section" means a contour having a shape described according to a view taken along a plane transverse to a relevant direction, such as the direction of a channel path or a conductor path or the direction along which an axis extends. In the case of a curvilinear geometry, the path is based on the direction of a tangent vector at the point of interest. Conductor segments in the illustrated embodiments include both multi-stranded and solid core varieties and are generally filament-like, having a length dimension which is relatively large in proportion to a thickness dimension. The thickness dimension for a conductor segment is measurable along the contour in cross section, which contour is generally understood to be along a plane transverse to the length dimension, although the segment may follow a curved path such as a path of a channel 30.

FIGS. 8C-1 and 8C-2 illustrate alternate channel configurations wherein the conductor channel 30 may assume a V shaped surface contour in cross section. All of the views of V shape channels are based on a cross section taken along a coil row 12 in a plane transverse to the path of the channel 30, with an exemplary conductor 260 having a circular surface contour in cross section. Two channel loops, e.g., loops 32 or 72 of FIG. 1B or 1E, are shown in each example with the conductor contacting the channel 30 at first and second contact locations along the V shaped channel contour. In the example of FIG. 8C-1, for the V shaped channel surface contour 262, the first location is a relatively flat region 264 along a first side 266 of the contour 262 and the second location is a relatively flat region 268 along a second side 270 of the contour 262. The contour sides 266 and 270 define the surface of the V shaped channel. The contour 262 includes a vertex, V, where the sides 266 and 270 meet at a depth, D, below the layer surface 160. Portions of conductor in the adjacent loops may, as illustrated, contact one another, in which case the conductor surface, S, includes an insulative coating. A relatively high conductor density is achievable, compared to a U shaped channel contour having the majority of the conductor surface placed in the channel.

In the example of FIG. 8C-1, the width, W, of the channel along the layer surface, e.g., surface 160, is about twice the radial dimension, $R_W$, measurable about the circular surface contour of the conductor 260. The width, W, may be greater than or less than twice $R_W$ thereby allowing the conductor to recess more deeply or entirely in the channel 30, or to achieve a higher profile above the surface 160. In the illustrated example, adjoining loops of the channel are not spaced apart so that there is no material thickness of the layer, e.g., a layer 14, intervening between the loops. The contour 262 has a "tall" profile, i.e., the ratio W/D is relatively small and the vertex subtends a small angle.

In the example of FIG. 8C-2, for the V shaped channel contour 272, the first contact location is a relatively flat region 274 along a first side 276 of the contour 272 and the second contact location is a relatively flat region 278 along a second side 280 of the contour 272. The contour 272 includes a vertex V where the sides 276 and 280 meet at a depth, D', below the layer surface 160. The contour sides 276 and 280 define the surface of the V shaped channel. Portions of conductor in the adjacent loops may, as described for the channel contour 262, contact one another, in which case the conductor surface, S, may include an insulative coating. In this example, a relatively high conductor density is also achievable, compared to a U shaped channel contour having the majority of the conductor surface placed in the channel. In the example of FIG. 8C-2, the width, W, of the channel along the layer surface, e.g., surface 160, is also about twice the radial dimension, $R_W$, measurable about the circular surface contour of the conductor 260, but may be varied depending on the desired profile of the conductor 260 with respect to the layer surface 160. Adjoining loops of the channel are not spaced apart so that there is no material thickness of the layer, e.g., a layer 14, intervening between the loops. The contour 272 has a "short" profile, i.e., the ratio W/D' is relatively large compared to W/D and the vertex, V, subtends an angle of about 90 degrees. The V shaped grooves of FIG. 8C allow for cooling channels.

When the conductor 260 is positioned in a V shaped channel, contact between the conductor surface, S, and the channel surface (e.g., side 266 or side 276) is limited to individual, spaced apart regions of contact, e.g., 264, 268 or 274, 278 along the channel surface. As a result of this arrangement, with reference to FIG. 8C-1, a portion 282 of the conductor surface S is spaced away from the channel surface, e.g., about the vertex region where the sides 266 and 270 meet one another, while adjacent portions 284 and 286 of the conductor surface S each contact one of the channel sides 266, 270.

FIGS. 8C-3 and 8C-4 and 8D illustrate a variety of other exemplary alternate configurations wherein the conductor channel 30 may assume other multi-sided contours in cross section having three or more sides. These and the foregoing illustrations are schematic in nature such that shapes and relationships between lines are not to be construed as precise. For example, the views of V shape channels shown in FIGS. 8C-1 and 8C-2 are based on straight line segments but it will be apparent that the surfaces do not have to form flat sides in order to achieve desired results.

Figure 3B:
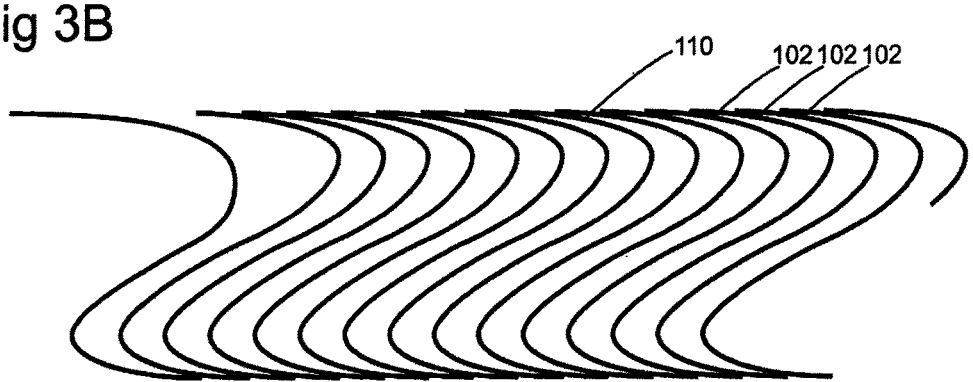
Figures 4, 8C:
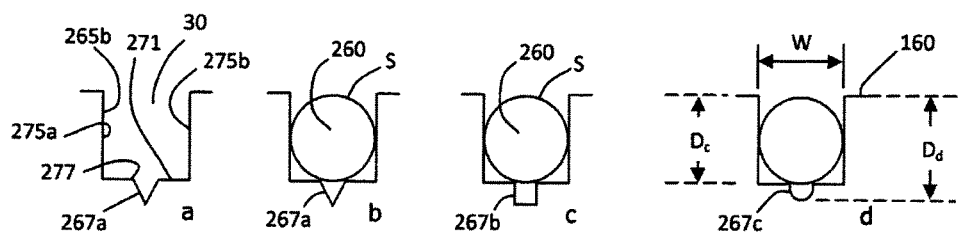

FIGS. 8C-3 and 8C-4 illustrate alternate channel configurations wherein the conductor channel 30 includes a major region 265 of suitable surface contour in cross section for accommodating a conductor 260. The major region may assume a U shaped surface profile 265a or a quadrilateral-like surface profile 265b. All of the views of FIGS. 8C-3 and 8C-4 are based on a cross section taken along a coil row 12 in a plane transverse to the path of the channel 30, with the exemplary conductor 260 having a circular surface contour in cross section. The conductor is not shown in all of the illustrations in order to more clearly present features of the major regions 265 and associated minor regions 267. The minor regions 267 are suitable for assuring presence of a gap or void between a portion of the conductor surface, S, and a portion of the channel surface. Generally, the conductor 260 contacts a given surface contour along the channel 30 at first and second contact locations which are spaced apart by the minor region 267. In the examples shown, the minor region 267 may, as shown for the embodiment of FIG. 8C-4c, be positioned about a lower surface portion 271, e.g., a channel bottom surface, of a major region. With reference to FIGS. 8C-3a and 8C-3b, the conductor 260 contacts opposing sidewalls of the U shaped channel 30 at first sidewall contact portion 273a of the channel and at second sidewall contact portion 273b of the channel.

Figures 1, 8D:
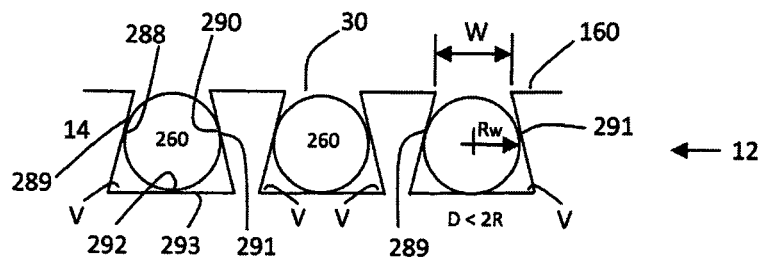
Figures 2, 8D:
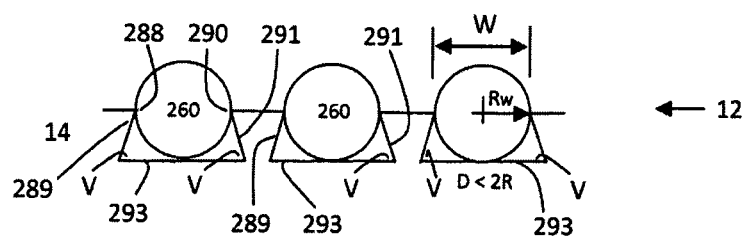
Figures 3, 8D:
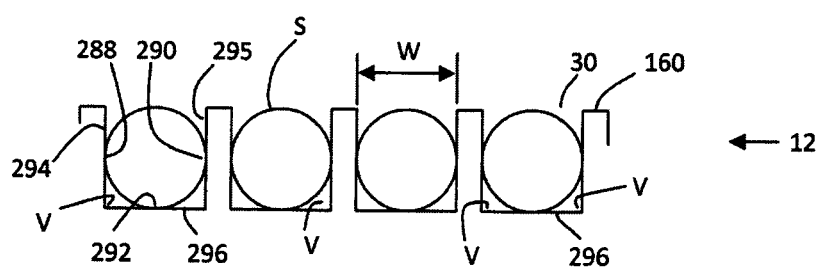

With reference to FIGS. 8C-4a and 8C-4b, the conductor 260 contacts opposing sidewalls of the channel 30 at first sidewall contact portion 275a of the channel and at second sidewall contact portion 275b of the channel. As shown in the figures, the minor region 267 may have a V shape profile, i.e., surface contour in cross section, 267a, a quadrilateral-like profile 267b, or a U or curve shape profile 267c, while other geometries are also suitable. With reference to FIGS. 8C-4(a-d), a feature of these embodiments is that a lower surface, e.g., lower surface portion 271 extends a maximum distance D, from the layer surface 160, while the surface contour in cross section of an adjoining minor region, e.g., along any of the surface contours 267a, 267b or 267c, extends a greater distance, e.g., the distance $D_d$ from the layer surface 160 than the first distance D. As illustrated, lower surface, e.g., lower surface portion 271 adjoins the minor region 267 about a surface region 277, having an abrupt change in radius of curvature, e.g., a corner profile. With the exemplary conductor 260, having a circular surface contour in cross section, placed in a channel 30, FIG. 8D illustrate quadrilateral channel shapes, i.e., shapes in cross section taken along a coil row 12 in a plane transverse to the path of the channel 30. Generally, these and other multi-sided shapes in cross section provide one or more spaces, each positioned about a vertex where two adjoining sides meet one another. In FIGS. 8D-1 a channel of dovetail shape has a width, W, along the layer surface 160 sufficiently close to, but smaller than, diameter $2R_W$ of the conductor so that the conductor can be pressed into the layer 14 and securely positioned during operation of the assembly. Three channel loops, e.g., loops 32 or 72, are shown with the conductor contacting the channel 30 at first, second and third locations. In this example two portions 288, 290 of the conductor surface S contact wall portions 289, 291 of the channel while a third portion 292 of the conductor surface S contacts a lowermost surface 293 of the channel 30. The vertex angle, V, between each wall portion 289 and 291 and the lowermost channel surface 293 is less than 90 degrees. The conductor is shown as completely recessed in the channel, but other arrangements as shown in FIG. 8D-2 are contemplated.

In the arrangement of FIGS. 8D-3 the conductor is placed in a rectangular—shaped channel 30 wherein portions 288, 290, 292 of the conductor surface, S, make contact with opposing wall portions 294, 295 and a lowermost channel surface portion 296. A vertex V is formed where each wall portion 294, 295 meets the lowermost portion 296. The channel embodiments of FIG. 8D each include two vertices, V, such that a pair of cooling channels may be formed in the spaces corresponding to the vertices where the wall portions (289, 291), (294, 295) and the lowermost channel surface portion 293 or 296 meet. The channel surface, S, of a first contour includes at least three separate regions, e.g., portions 294, 295 and 296, each in separate contact with the conductor surface of second contour. Each of the three separate regions may correspond to one of three sides in a quadrilateral—like shape while a fourth side corresponds to the channel opening. In accord with the examples of FIG. 8, one or more portions of the conductor surface may be spaced away from a portion of the channel surface to provide a passage suitable for flow of liquid or gaseous cooling fluid. This can be effected when one or more locations on the channel surface each have a greater radius of curvature than that of an adjacent region along the surface, S, of the conductive segment.

With regard to the multiple example embodiments, the shapes which correspond to varying terms is now clarified. All referenced shapes are understood to be proximate. The term "rectangular-like shape" as used herein means a shape having two opposing surfaces with a relatively flat portion along each surface parallel to the other, with the two opposing surfaces separated by a third relatively flat portion; and in the context of a channel, the shape may have only three side walls with an open region extending between the two opposing surfaces, which open region corresponds to a side opposite the third relatively flat portion. The term "quadrilateral-like shape" as used herein means a shape, e.g., a channel shape, having two opposing surfaces with a relatively flat portion along each surface being parallel or non-parallel to the other, with the two opposing surfaces separated by a third surface portion; and in the context of a channel, the shape may have only three side walls with an open region of the channel, extending between the two opposing surfaces, corresponding to a side opposite the third surface portion. Thus, although referred to as rectangular or quadrilateral shapes, the shapes may be defined by as few as three identifiable surfaces, each corresponding to one of three sides, and an open region corresponding to a fourth side. The term trapezoidal shape refers to quadrilateral shapes including those having two opposing surfaces with a relatively flat portion along each opposing surface being non-parallel to the other. A dovetail shaped channel may be a trapezoidal shape or a quadrilateral shape.

With regard to shapes of surfaces, including channel surface contours, characterization of a surface or a portion of a surface as circular means that a region along a surface has curvature, but does not imply that the surface shape be that of a full circle. Further, reference to a circular shape is not limited to a surface having a constant radius of curvature. Comparatively speaking a surface having a defined radius of curvature is understood to have a smaller radius of curvature than a flat surface. Reference to a relatively flat surface means a surface that may not be perfectly flat but which has, on average, a greater radius of curvature relative to another surface or feature.

Figure 9A:
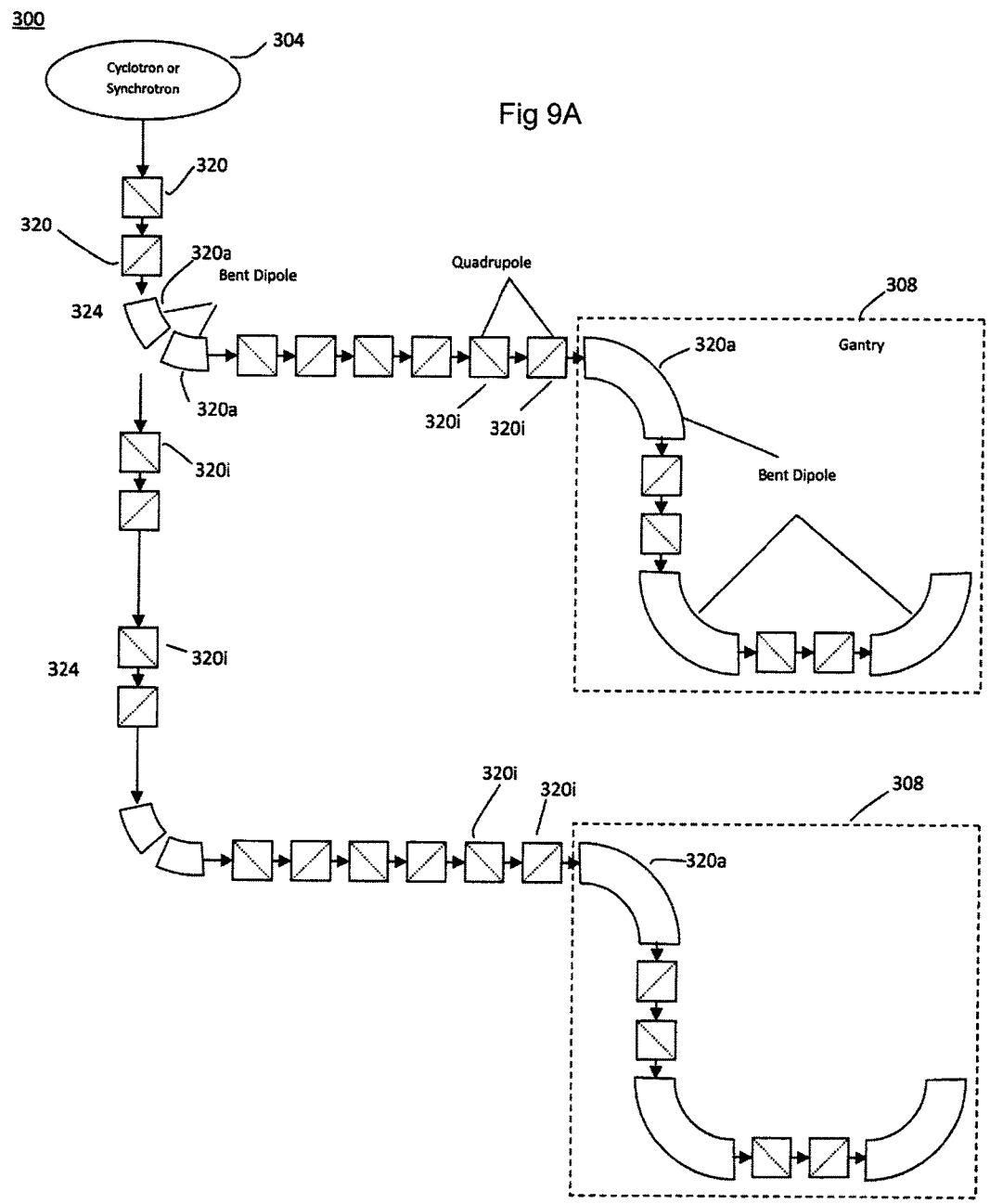
FIG. 9A is a simplifies schematic illustration of a charged particle therapy system according to the invention.
Figure 9B:
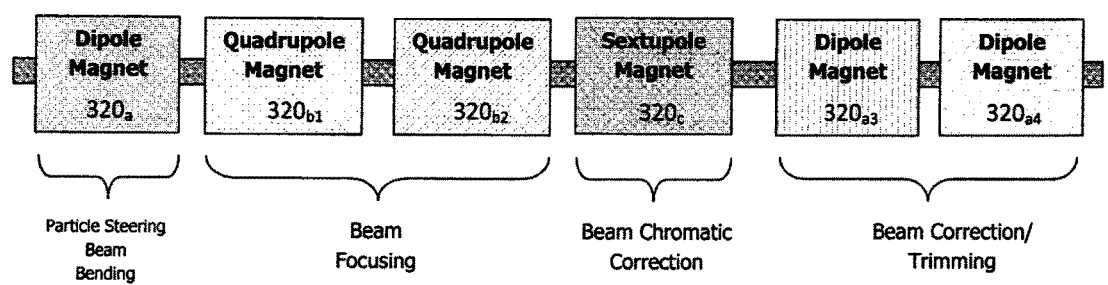
FIG. 9B illustrates a combination of a combination of magnet types each constructed according to the invention which are suitable for application in the system of FIG. 9A.

FIG. 9A is a schematic illustration of a charged particle therapy system 300 shown in simplified form. The system includes an accelerator 304 which generates high velocity charged particles, e.g., protons, that are transmitted to one or more gantries 308. Each gantry provides a focused predetermined dose along a designated corporal region in order to treat a tumor. Between the accelerator and the gantries the beam is steered and focused through a series 320 of magnets $320_i$ in order to provide a suitable beamline upon entry into each gantry. Within each gantry 308 the beam energy is shaped, rotated radially about the patient and delivered to the tumor. Generally, magnet systems which control the charged particle beam line are configured to provide combinations of straight and curved paths between the accelerator 304 and each gantry 308. For example, magnets $320_a$ generating dipole fields are used in bent sectors of the beamline trajectory to steer the beamline around a curve for entry into a gantry. The magnets $320_i$ incorporate coils such as the coil 10 according to the disclosed embodiments. FIG. 9B illustrates in a simplified example a combination of a dipole magnet $320_a$ for particle steering and beam focusing, a combination of two quadrupole magnets $320_{b1}$ and $320_{b2}$ for beam focusing, a sextupole magnet $320_c$ for imparting chromatic correction, and dipole magnets $320_{a3}$ and $320_{a4}$ for imparting further beam correction and trimming. All of the aforementioned components $320_i$ are positioned in a trajectory 324 (see FIG. 9A) between the accelerator 304 and the gantries 308. The beamline includes further magnet components to divide the trajectory into a separate path for each gantry 308.

The system 300 benefits from incorporation of coils built according to the embodiments disclosed, e.g., such as the coil 10, in order to improve, for example, the quality of the magnetic field generated at various stages of the beamline and to improve the reliability and performance of the system 300. Other systems will benefit from the invention as well. These include, for example, magnetic resonance imaging (MRI) systems (e.g., for non-destructive inspection of cargo and detection of explosives), systems providing ion beam implantation, and other systems having medical, environmental and energy applications. With the aforedescribed channels formed in multiple concentric rows, the insulative layers may be formed with materials that can sustain high temperatures or high radiation doses. Ability to form the conductor in dedicated channel rows throughout the coil can, as shown for some example embodiments, eliminate the need for insulative coatings and can increase the cooling efficiency when a cooling source is positioned along or in contact with the conductor.

While the invention has been described with reference to particular embodiments, it will be understood by those skilled in the art that various changes may be made and equivalents may be substituted for elements thereof without departing from the scope of the invention. For example, although the coil 10 has been shown to be symmetric about a straight axis, numerous ones of the disclosed features can be advantageously applied in other applications such as wherein the axis is curvilinear or generally asymmetric.

The claimed invention is:

1. A method for constructing a conductor assembly of the type having a coil which, when conducting current, generates a magnetic field or which, in the presence of a changing magnetic field, induces a voltage, comprising:
   providing a first layer having a surface and having a thickness;
   forming a channel in the first layer defining a first conductor path, the channel including first and second opposing channel surfaces each extending from the surface of the first layer into the first layer, said channel having a depth extending from the surface that is less than said first layer thickness; and
   pressing at least a first segment of conductor in the channel to form the coil;
   wherein said first and second opposing channel surfaces are further defined as forming two opposing surfaces of a dovetail shaped channel cross section having an opening width along said layer surface, and wherein said conductor has an outer dimension that is larger than said opening width, requiring said conductor to be pressed into said channel and capturing said conductor so that Lorentz forces applied to said conductor during operation of the coil are resisted by said first and second opposing channel surfaces.

2. The method of claim 1 wherein the step of forming the channel includes defining a spiral path.

3. The method of claim 1 wherein the first layer provided is an insulative layer.

4. The method of claim 1 wherein the step of forming the channel includes defining the channel as a spiral path about an axis.

5. The method of claim 4 wherein the surface of the first layer is provided as a cylindrical shape and defining the channel includes forming the channel as a spiral path along the cylindrical shape so the channel revolves about a central axis.

6. The method of claim 1 wherein pressing the conductor into the channel reduces conductor movement in the coil.

7. The method of claim 6 wherein the step of forming the channel includes providing a channel profile dimensioned with such close tolerance with respect to a width or diameter of the conductor that micron movement of the conductor in the channel is prevented.

8. The method of claim 6 wherein the step of forming the channel includes providing a channel profile dimensioned with such close tolerance with respect to a width or diameter of the conductor that submicron movement of the conductor in the channel is prevented.

9. The method of claim 6 wherein:
pressing at least a first segment of conductor into the channel includes pressing a coil of superconductor into the channel; and
forming the channel includes providing a channel profile dimensioned with such close tolerance with respect to a width or diameter of the superconductor that movement of the super conductor in the channel to an extent which causes quench is prevented.

10. The method of claim 1 wherein pressing the conductor into the channel is performed by pressing a conductor having a rectangular shape into the channel.

11. The method of claim 10 wherein pressing the conductor having a rectangular shape into the channel is performed by pressing Rutherford type cable or YBCO-based high temperature superconductor wire into the channel.

12. A method for constructing a conductor assembly of the type which, when conducting current, generates a magnetic field or which, in the presence of a changing magnetic field, induces a voltage, comprising:
providing a first insulative layer having a curved surface along which a conductor segment may be positioned, said insulative layer having a thickness;
forming a channel in the insulative layer defining a first conductor path, the channel including first and second opposing channel surfaces each extending from the surface of the insulative layer into the insulative layer and a third channel surface extending between the first and second channel surfaces, each of the first and second channel surfaces including a substantially flat surface portion, said channel having a depth extending from said surface that is less than said insulative layer thickness;
wherein said first, second and third channel surfaces together form a dovetail shaped channel cross section having an opening width along said layer surface, and wherein said conductor has an outer dimension that is larger than said opening width, requiring said conductor to be pressed into said channel; and
pressing at least a first segment of conductor into the channel, capturing said conductor so that Lorentz forces applied to said conductor during operation of the coil are resisted by said first and second opposing channel surfaces.

13. The method of claim 12 wherein only one segment of conductor is pressed into the channel.

14. A conductor assembly of the type which, when conducting current, generates a magnetic field or which, in the presence of a changing magnetic field, induces a voltage, comprising:
a first layer having a thickness and a surface with a channel formed therein, the channel having a channel depth extending from said surface that is less than said first layer thickness, said channel following a predefined path, said channel being of dovetail cross section having an opening width along said layer surface; and
a first conductive segment having an outer dimension larger than said channel opening, said first conductive segment pressed into the channel, capturing said first conductive segment in a press fit in said channel such that Lorentz forces applied to said conductor during operation of the coil are resisted by said press fit of said first conductive segment into said channel and extending along the channel path.

15. The assembly of claim 14 wherein the first layer comprises insulative material.

16. The assembly of claim 15 further including a second insulative layer coating part of the surface of the first layer and part of an outer surface of the first conductive segment so that the first segment of conductor is covered with a coating comprising one or more layers of electrically isolating insulator material.

17. The assembly of claim 14 wherein only one conductor segment is positioned in the channel.

* * * * *